United States Patent [19]

Nishiyama et al.

[11] Patent Number: 5,043,914

[45] Date of Patent: Aug. 27, 1991

[54] CIRCUIT TRANSFORMATION SYSTEM, CIRCUIT TRANSFORMATION METHOD, INVERTED LOGIC GENERATION METHOD, AND LOGIC DESIGN SYSTEM

[75] Inventors: Tamotsu Nishiyama, Hirakata; Noriko Matsumoto, Uji; Masahiko Ueda, Kashiwara; Masahiko Matsunaka, Osaka, all of Japan

[73] Assignee: Matsushita Electric Industrial Co., Ltd., Osaka, Japan

[21] Appl. No.: 249,555

[22] Filed: Sep. 26, 1988

[30] Foreign Application Priority Data

Sep. 25, 1987 [JP] Japan .............................. 62-241288
Jan. 22, 1988 [JP] Japan ................................ 63-12941
Mar. 15, 1988 [JP] Japan ................................ 63-61082

[51] Int. Cl.$^5$ ............................................. G06F 15/18
[52] U.S. Cl. ..................................... 364/513; 364/488
[58] Field of Search ............... 364/513, 488, 489, 490, 364/491, 900, 300

[56] References Cited

U.S. PATENT DOCUMENTS 4,703,435 10/1987 Darringer et al. .................. 364/489
4,803,636 2/1989 Nishiyama et al. ................. 364/488

OTHER PUBLICATIONS

"Artificial Intelligence Helps Cut ASIC Design Time," Jin Kin Electronic Design, Jun. 1987, pp. 107-110.
"A Knowledge-Based System for Designing Testable VLSI Chips," Abadin et al., Aug. 1985.

Primary Examiner—Allen R. MacDonald
Attorney, Agent, or Firm—Wenderoth, Lind & Ponack

[57] ABSTRACT

Circuit transformation of a first circuit constituted by a first set of elements into a logically equivalent second circuit constituted by a second set of elements is effected by selecting a candidate rule from a knowledge base memory. The knowledge base memory stores therein transformation rules expressed by a condition part and a conclusion part. The condition part of a candidate rule is matched to circuit data stored in a working memory. The application condition of the candidate rules is determined, and the candidate rule is applied to the circuit data of the working memory for transforming the circuit after confirmation of the establishment of the application condition. The knowledge base memory stores therein concise transformation rules including at least one of main transformation rules, subordinate transformation rules, logic negation rules and logic equivalence rules.

26 Claims, 24 Drawing Sheets

FIG. 2

$A, B, C_1, D_1 \longrightarrow E_1, G$ $A, B, C_2, D_2 \longrightarrow E_2, F_2, G$ $A, B, C_3 \longrightarrow E_3, F_3, G$ ⇓ Hierarchical Structuring

[Main Rule]

$A, B \longrightarrow *, G$

[Subordinate Rule]
$\begin{cases} *, C_1, D_1 \longrightarrow E_1 \\ *, C_2, D_2 \longrightarrow E_2, F_2 \\ *, C_3 \longrightarrow E_3, F_3 \end{cases}$ Main Rule (NOR is connected to NOR output of which fan out is 1) ⇒ (AND-NOR complex gate is used)

Subordinate Rule (When using AND-NOR complex gate, 2-input and 3-input NOR are connected to the inputs of 2-input NOR) ⇒ (Inverter connected to inputs of AND-NOR complex gate antdoo)

Expanding Rule (Logic inversion of plural signals) ⇒ (Inverter is attached to each signal)

Example of data expressing
circuit of Fig. 4(b)

```
                        42 Attribute Code
       41 Identity Name        43 Attribute Value
       /              /       /
       gate 01 ::: a-kind-of :: nor  ;   ;

input    :: [sig1, sig2, sig3] ;

output   :: sig4 ;

fanout   :: 3  .
```

Circuit composed of
3-input nor of 3 fan-outs

FIG. 8 (a)

Description Example of Main Rule

```
(Gate1 ::: a_kind_of  :: nor ;
        input       :: [Y1,Y2|L2];
        output      :: Z ;
        fanout      :: N),
length(L2,M2),M2=<2,
(Gate2 ::: a_kind_of  :: nor ;
        input       :: [X1|L1] ;
        output      :: Y1 ;
        fanout      :: 1).
length(L1,M1), M1=<3,
M1+M2=<2
   ==> @ (Gate ::: a_kind_of  :: and_nor ;
             input(a)    :: [X1|L1] ;
             input       :: [Y2|L2];
             output      :: Z ;
             fanout      :: N).
```

FIG. 8 (b)

Description Example of Subordinate Rule

```
(Gate ::: a_kind_of  :: and_nor ;
       input(a)    :: [X11,X12];
       input       :: [Y2] ;
       output      :: Z ;
       fanout      :: N),
(Gate0 ::: a_kind_of  :: nor ;
        output      :: Y2;
        input       :: [X21,X22,X23];
        fanout      :: 1 )
  @=> # (Gate1 ::: a_kind_of  :: inverter ;
             input       :: [X11,X12];
             output      :: [NX11,NX12] ;
             fanout      :: 1 ),
      # (Gate2 ::: a_kind_of  :: inverter ;
             input       :: [X21,X22,X23];
             output      :: [NX21,NX22,NX23];
             fanout      :: 1 ),
      (Gate3 ::: a_kind_of  :: antdoo ;
             input(a)    :: [NX11,NX12];
             input(b)    :: [NX21,NX22,NX23];
             output      :: Z ;
             fanout      :: N),
```

FIG. 9

```
(Gate ::: a_kind_of :: inverter ;
        input      :: [X|L1];
        output     :: [Y|L2];
        fanout     :: N)
#=) (Gate ::: a_kind_of :: inverter ;
              input      :: X ;
              output     :: Y ;
              fanout     :: N).
   # (Gate ::: a_kind_of :: inverter ;
             input      :: L1 ;
             output     :: L2 ;
             fanout     :: N).

(Gate ::: a_kind_of :: inverter ;
        input      :: [] ;
        output     :: [] ;
        fanout     :: N)
#=) true.
```

FIG. 15

```
( Gate 0 ::: a_Kind_of   ::  or ;
          input          ::  [X1,X2] ;
          output         ::  Z )
==> (Gate 1 ::: a_Kind_of   :: inverter;
              input         :: X1 ;
              output        :: Y1 ) ,
    (Gate 2 ::: a_Kind_of   :: inverter;
              input         :: X2 ;
              output        :: Y2 ) ,
    (Gate 3 ::: a_Kind_of   :: nand ;
              input         :: [Y1,Y2] ;
              output        :: Z ).
```

FIG. 16

```
(Gate  ::: a_kind_of  :: and ;
            input     :: [X:L] ;
            output    :: Z )
  =~ (Gate ::: a_kind_of :: nand ;
            input     :: [X:L] ;
            output    :: NZ ).

(Gate  ::: a_kind_of  :: or ;
            input     :: [X:L] ;
            output    :: Z )
  =~ (Gate ::: a_kind_of :: nor ;
            input     :: [X:L] ;
            output    :: NZ ).

```
(Gate0  ::: a_kind_of :: or ;
            input     :: [X1,X2] ;
            output    :: Z ).
  ==> (Gate1 ::: a_kind_of :: nand ;
            input     :: [~X1,~X2] ;
            output    :: Z ).
```

.
.
.

CIRCUIT TRANSFORMATION SYSTEM, CIRCUIT TRANSFORMATION METHOD, INVERTED LOGIC GENERATION METHOD, AND LOGIC DESIGN SYSTEM

BACKGROUND OF THE INVENTION

This invention relates to an automatic transformation of a logic circuit, and more particularly to a circuit transformation method and logic design system for optimally transforming a function description or logic circuit into a logically equivalent circuit for a specific technology.

A conventional circuit automatic transformation system utilizes a method in which a portion coinciding with a predefined input pattern is detected from a circuit before transformation, and is replaced directly with a corresponding output pattern according to a given condition, such as the fan-out number of the output terminal (mentioned, for example, in the Collected Papers of the 30th National Convention of Information Processing Society of Japan, pp. 1923-1926, 1985). Furthermore, in a system using a knowledge base (that is, rule base), a rule description system for describing the preliminary condition for activating the rule in the condition part of the rule, and describing the operation (that is, the action) on the circuit when that rule is activated in the conclusion part is widely employed. An apparatus of this sort is disclosed, for example, in the Japanese Laid-open Patent No. 59-168545.

In this conventional example, however, considerations are not given to the simplification of the circuit transformation rule, the efficiency of the transformation rule making, its ease of operation, and the efficiency of circuit transformation processing, and the following enumerated problems, among others, exist.

(1) It is necessary to make many transformation rules differing only in part, such as the condition part and conclusion part of the transformation rule.

(2) Unlike the transformation rule possessed by the designer, it is necessary to describe, in an unnatural form, how to change the circuit, being conscious of the deduction mechanism, when describing the conclusion part of the rule.

(3) In order to realize an advanced transformation from a comprehensive viewpoint conducted by a skilled designer, the description quantity per rule is enormous, and the number of rules is tremendous, which makes actual realization difficult.

(4) From the viewpoint of transformation processing efficiency, there are many transformation rules similar in the condition part, the inference efficiency is very poor, and a lengthy processing time is needed for transformation.

(5) When divising and describing a transformation rule in plural rules, wasteful accesses addition of intermediate data to the description part for working (working memory), retrieval and deletion increase, and the efficiency of inference processing is extremely poor.

SUMMARY OF THE INVENTION

It is hence a primary object of this invention to present a circuit transformation method, circuit transformation system, and logic design system capable of easily receiving the circuit transformation knowledge possessed by the designer in a simple form of a transformation rule, and realizing circuit transformation as easily and proficiently as a skilled designer.

This object is achieved, in a circuit transformation system using a knowledge or rule base, by providing; an inference means with rule requisition means for transmitting the information for selecting a subordinate transformation rule required for circuit transformation when a transformation rule is applied; rule selection means for selecting a desired transformation rule by receiving this transmission information; rule replacing means for replacing all or part of the condition part of the conclusion part of the transformation rule by using the transformation rule; removal element pickup means for automatically picking up the element to be removed on the basis of the transformation rule; element removal means for removing the picked-up element, and; means for automatically additionally registering the element appearing in the conclusion part of the transformation rule.

The above object may be also achieved, in a circuit transformation system using a knowledge or rule base, by including a logic negation knowledge base memory, and providing the inference means with element addition means having means for judging the signal for expressing the logic negation in the connection signal of the element, and negated signal generating means for generating or depicting a negated signal by making use of the logic negation relation expressed in the logic negation inversion rule stored in this logic negation knowledge base memory.

The same object may be also achieved, in a circuit transformation method and logic design system using a knowledge or rule base, by installing equivalent logic knowledge memory means, and by performing, in a step of applying the rule by storing the logically equivalent circuit relation, that is, the equivalent logic rule, using this memory means, a processing operation for recognizing a circuit logically equivalent to the circuit of the rule premise part by using this equivalent logic rule, and a processing operation of generating a circuit logically equivalent to the circuit in the rule termination part by using the same equivalent logic rule.

While the novel features of the invention are set forth in the appended claims, the invention, both as to organization and content, will be better understood and appreciated, along with other objects and features thereof, from the following detailed description taken in conjunction with the drawings.

BRIEF DESCRIPTION OF DRAWINGS

FIG. 2 is a conceptual drawing of the hierarchical structure of a rule;

FIGS. 8(a)-(b) are explanatory drawings showing a description example of a transformation rule;

FIG. 9 is an explanatory drawing showing a description example of an expanding rule;

FIG. 15 is an explanatory chart showing a description example of a transformation rule;

FIG. 16 is an explanatory drawing showing a description example of a logic negation rule;

FIG. 17 is an explanatory drawing showing a description example of a transformation rule using a logic negated signal;

DETAILED DESCRIPTION OF THE INVENTION

Figure 1:
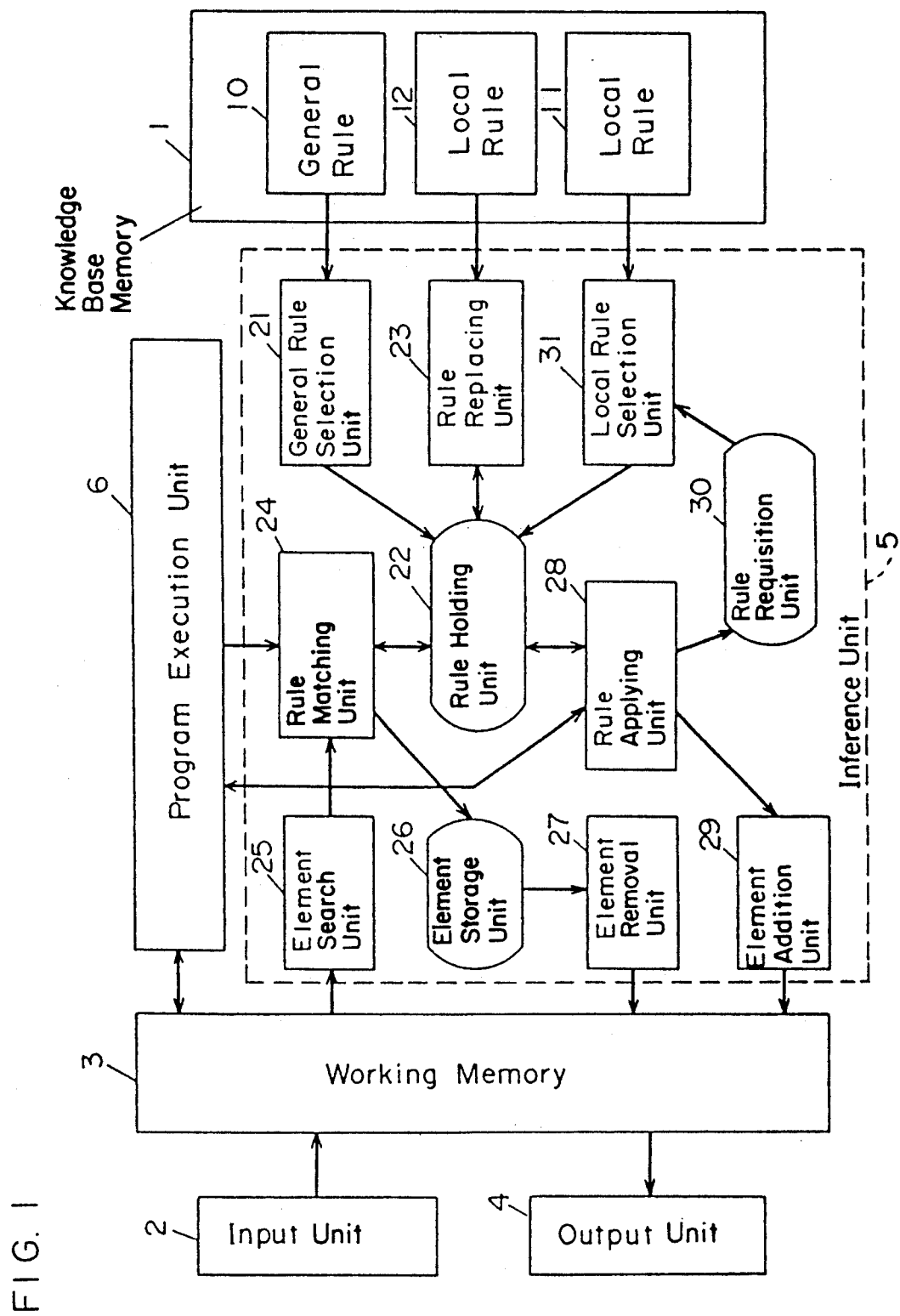
FIG. 1 is a block diagram showing a basic structure in a first embodiment of this invention.

Some of the embodiments of this invention are described below with reference to the accompanying drawings.

First embodiment

Referring now to the drawings, a first embodiment of this invention is described below.

FIG. 1 is a block diagram showing a basic structure of the first embodiment of this invention. Numeral 1 denotes a knowledge base memory, 2 is an input unit, 3 is a working memory, 4 is an output unit, 5 is a inference unit (interpreter), and 6 is a program execution unit for storing and executing a program as required. The inference unit 5 is Composed of general rule selection unit 21, rule holding unit 22, rule replacing unit 23, rule matching unit 24, element search unit 25, element storing unit 26, element removal unit 27, rule applying unit 28, element addition unit 29, rule requisition unit 30, and local rule selection unit 31.

Each part is explained in detail below.

The knowledge base memory 1 stores transformation rules of plural kinds, such as a general rule 10, and local rules 11, 12, etc. For example, the general rule 10 is a main rule, or a transformation rule as shown in FIG. 3(a). The local rule 11 is a subordinate rule, or a transformation rule as shown in FIG. 3(b). The subordinate rule may become a main rule of another subordinate rule. The local rule 12 is an expanding rule, such as a rule for expanding a gate having plural bit widths in every bit as shown in FIG. 3(c).

Figure 3:
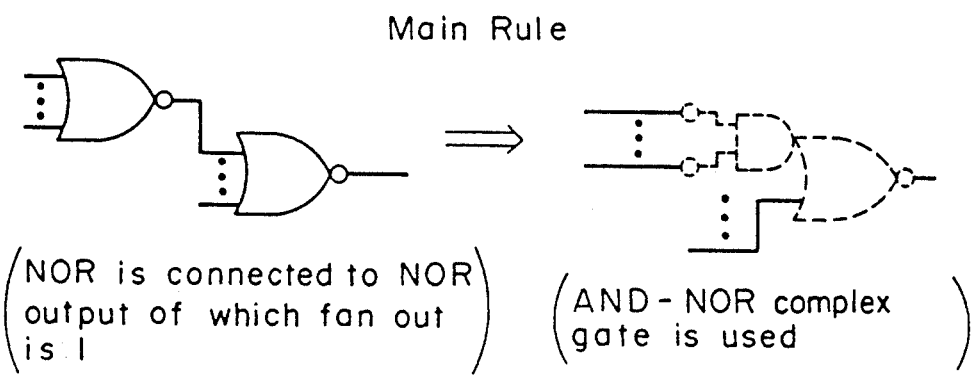
FIGS. 3(a)-(c) are explanatory drawings showing an example of a transformation rule.
Figure 3:
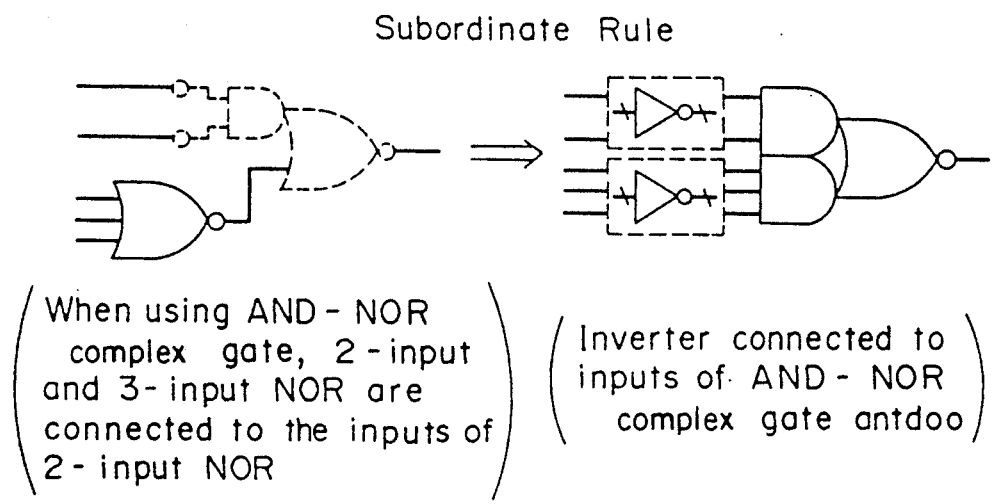
Figure 3:
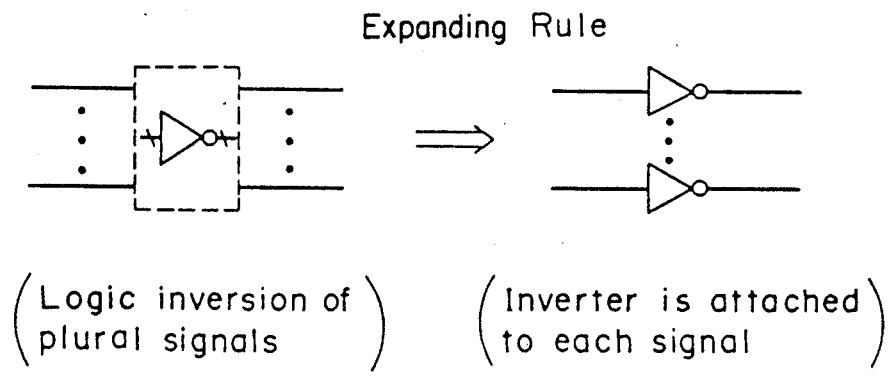

FIG. 3 is an example of an IF-THEN type rule for transforming an abstract logic circuit which is not dependent on a given technology into a logically equivalent circuit composed of standard cells of CMOS type transistors. The main rule in FIG. 3(a) expresses a general rule meaning, "If other NOR gate is connected to the output of a certain NOR gate of which fan-out is 1, an AND-NOR complex gate making rule applied." The subordinate rule in FIG. 3(b) is an AND-NOR complex gate making rule, and it is a local rule meaning, "If two input NORs and three input NORs are connected to two input NORs respectively, they are transformed into standard cell antd00 and inverters connected to each input." However, the inverter connected to each input is expressed in macro simplified in the logic inversion having bit widths of 2 bits and 3 bits. The expanding rule in FIG. 3(c) is to expand the simple expression "to transform the logic inversion macro having a bit width of plural bits into the inverter of each bit" into a real expression. In this embodiment, meanwhile, only two types of local rules 11, 12 are shown for the sake of simplicity, but is is also possible to classify multiple types of local rules.

The input unit 2 enters the data expressing the circuit before transformation into the working memory 3.

Figure 4:
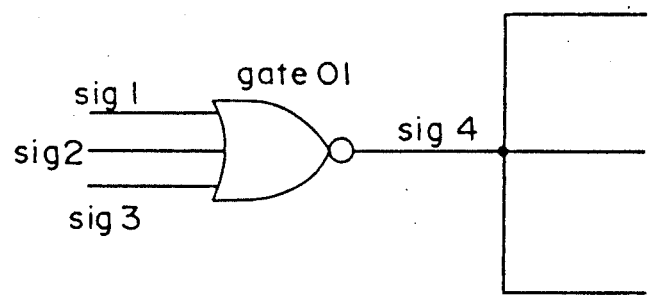
FIGS. 4(a)-(b) are explanatory drawings showing an example of circuit expression.

The working memory 3 stores data expressing the circuit before transformation, the circuit during transformation and the circuit after transformation. An example of data expressing the circuit stored in the working memory 3 is shown in FIG. 4. FIG. 4 shows data for expressing a circuit by the input-output relation among elements, centered on elements. FIG. 4(a) is an example of data expressing the circuit of FIG. 4(b). The data is composed of, basically, an identity name 41 for identifying individual elements, plural attribute codes 42, and their attribute values 43. In the example in FIG. 4(a), the pair of attribute code 42 and attribute value 43 is expressed by "::" and each pair is divided by ";". The identity name 41 is distinguished from other data by ":::". Attribute codes 42 include "a-kind-of" for expressing the type of element, "input" for expressing the input signal name, and "fanout" for expressing the fan-out. This is an example of the data of the working memory 3. Furthermore, as the data in the working memory 3, data expressing the circuit according to signalling (that is, net) may be used, instead of according to the element as in this example.

The output unit 4 receives the data expressing the circuit after transformation from the working memory 3.

The program execution unit 6 stores the execution forms of various programs (or load modules) coded according to programming languages such as Prolog, Lisp, C, etc., and executes these programs in response to a command from the inference unit 5 (particularly the rule matching unit 24 and rule applying unit 28). These programs may include a judgement of the condition in the condition part, various calculations, and procedures in the conclusion part.

The operation function of each unit within the inference unit 5 is explained together with the processing procedure.

Figure 5:
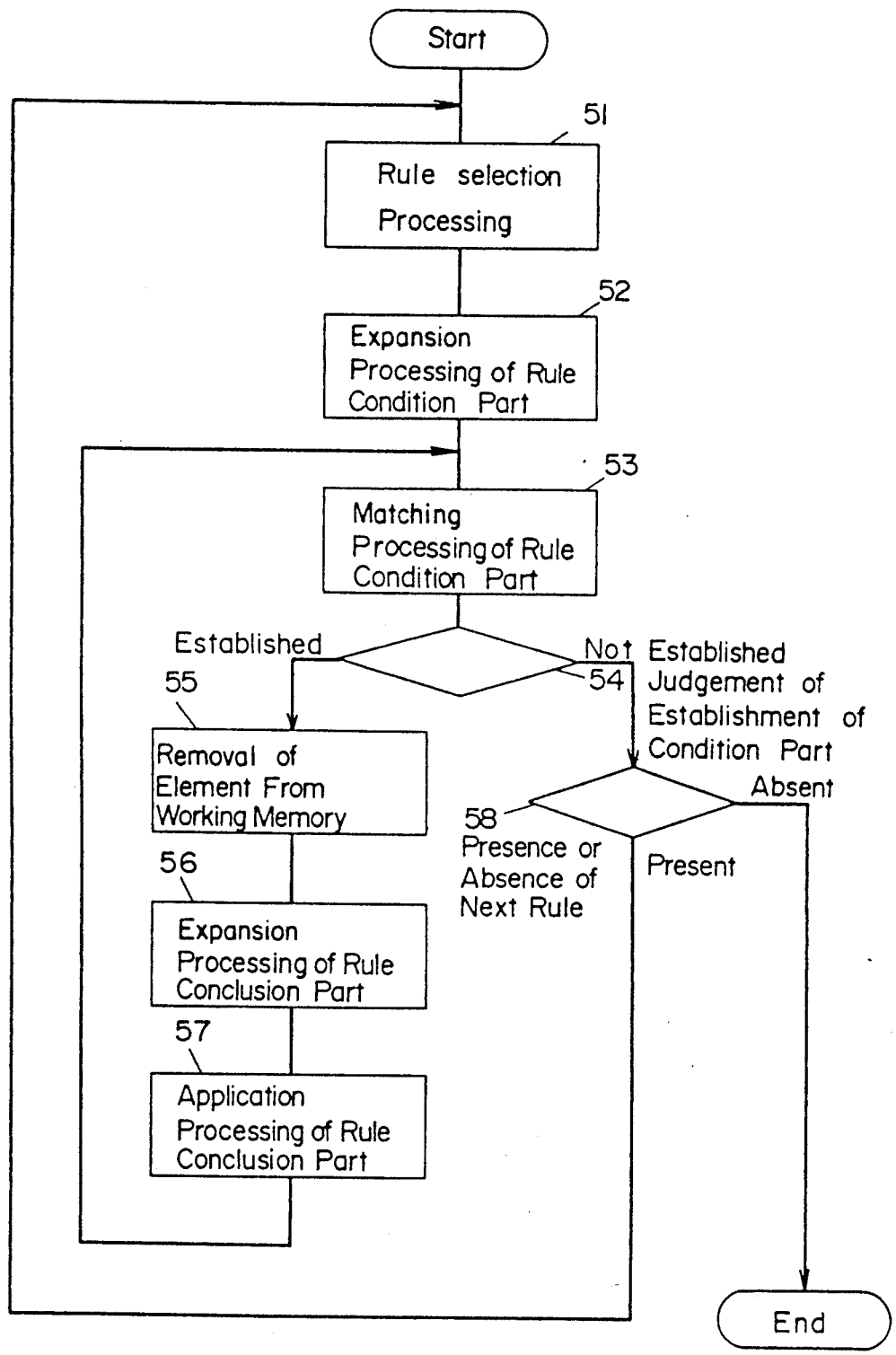
FIG. 5 is a flow chart showing an example of circuit transformation processing in the inference means of the embodiment.

FIG. 5 is a flow chart showing an example of the circuit transformation processing carried out in the inference unit.

A processing step 51 is for selecting the transformation rule sequentially in the order of priority, in consideration of the cancellation of competition of the transformation rule. The step 51 is processed by the general rule selection unit 21 or local rule selection unit 31 shown in FIG. 1 The priority order of the transformation rules may be determined either beforehand for each rule, or by a certain evaluation function (index) or the like.

A processing step 52 is for checking the portion of the condition part of the transformation rule selected in step 51 with the condition part of the local rule 12, and if there is a match, replacing that portion by the conclusion part of the local rule (expansion processing of the rule condition part). Step 52 is processed by the rule replacing unit 23 shown in FIG. 1. Examples of this expansion processing include the expansion of each bit of the macro having a bit width, and the expansion into a realization of a simplified expression.

A processing step 53 is for matching each term of the condition part of the transformation rule which is the output of processing step 52 with the data in the working memory, 3 shown in FIG. 1 by means of the rule matching unit 24 (details of which are described later).

A step 54 is for determining whether or not the condition part of the rule is established using the matching processing of processing step 53. If it is established, step 55 is executed, and if it is not established, step 58 is executed.

A processing step 55 is for removing the elements stored in the element storing unit 26 from the data in the working memory 3 sequentially, using the element removal means 27 shown in FIG. 1.

A processing 56 is for checking the portion of the conclusion part of it applicable transformation rule, with the condition part of the local rule 12, and if there is a match, replacing that portion for the conclusion part of the local rule (expansion processing of the rule conclusion part). Step 56 is processed, by the rule replacing unit 23 shown in FIG. 1.

A processing step 57 is for updating the data in the working memory 3, adding an element, or activating the subordinate rule, using the rule applying unit 28 shown in FIG. 1 (details of processing which are described later).

After this processing step 57, the operation returns to processing step 53, and the same transformation rule is matched with the data in the working memory 3.

A step 58 is for determining whether or not the transformation rule to be applied next to the presently selected transformation rule is present in the knowledge base memory 1. If present, the operation returns to processing step 51, and the next transformation rule is selected. If not present, the transformation processing is terminated.

Figure 6:
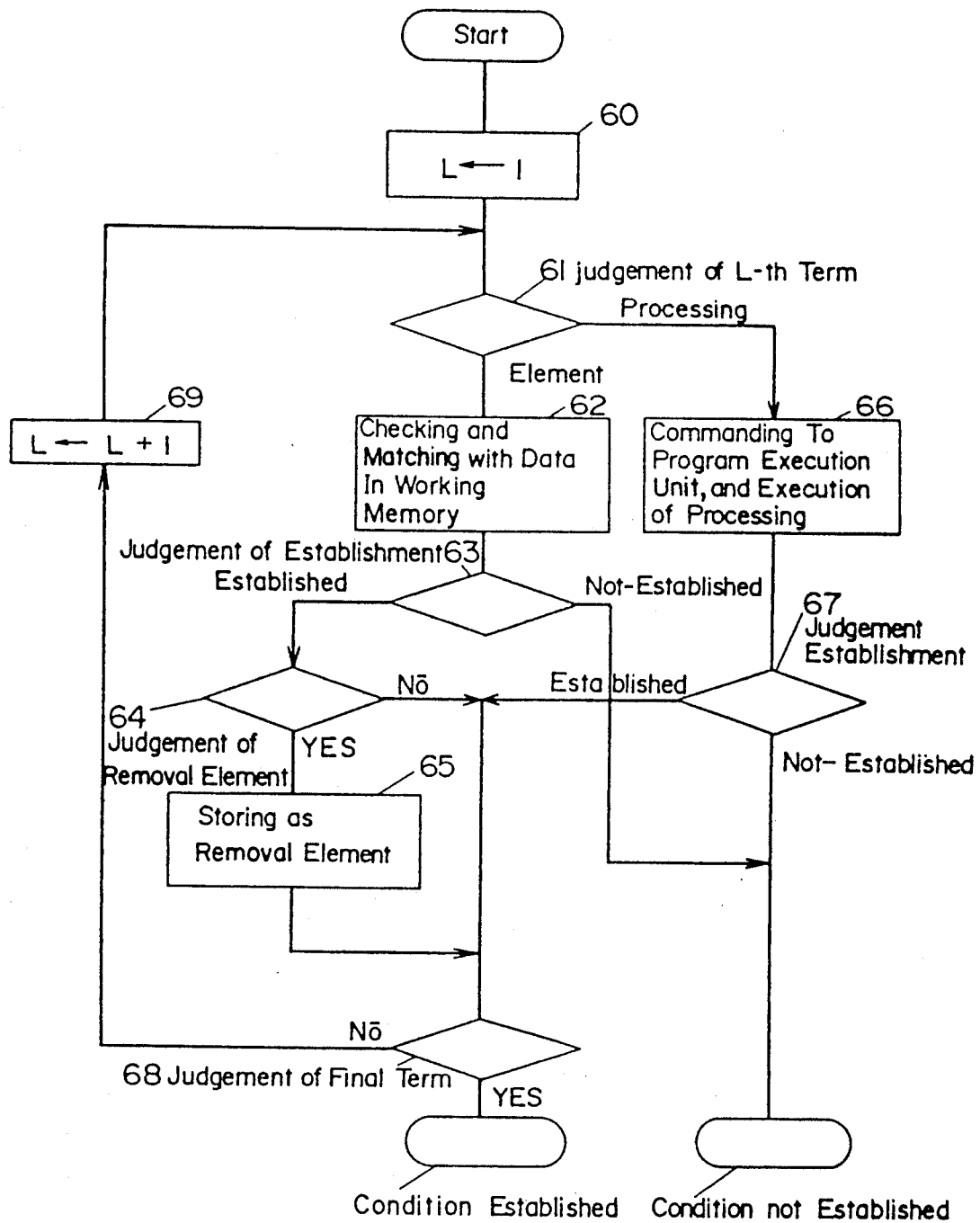
FIG. 6 is a flow chart showing an example of matching processing of the rule condition part.

FIG. 6 is a flow chart showing a match processing example processing of the rule condition part in step 53.

A step 60 is for specifying the term to be processed in the condition part of the transformation rule as the first term. That is, term number L of the processing term is 1.

A step 61 is for determining whether or not the term being processed that is the L-th term, expresses an element. If the L-th term expresses an element, step 62 is processed, and otherwise step 66 is executed.

A step 62 is for determining if the element corresponding to this L-th term is present in the working memory 3, using the element search unit 25 shown in FIG. 1.

A step 63 is for determining whether or not the corresponding element was present in the foregoing step 62. If present (established), step 64 is processed, and if not present, the processing is terminated because the condition is not established.

A step 64 is for determining whether or not the element of which existence has been confirmed in step 62 should be deleted when applying this transformation rule (that is, after the rule condition is established). If the element is to be deleted, a step 65 is processed, an if it is not to be deleted, a step 68 is processed.

A step 65 is for storing the element judged in step 64 into the element storing unit 26 shown FIG. 1. However, nothing is stored in the element storing unit 26 in its initial state.

A step 66 is for executing various processing operations, such as the condition judgement represented by the L-th term, in accordance with the program execution unit 6.

A step 67 is for determining whether or not the judgement based on the processing executed in the step 66 is established. If established, a step 68 is processed, and if not established, the processing is completed, because the condition is not established. Meanwhile, if the processing executed in step 66 does not require a judgement, the judgement based on the processing is always regarded as established.

A step 68 is for determining whether or not the L-th term is the final term. If it is the final term, processing is completed since the condition is established, and if it is not the final term, 1 is added to L in step 69, and the steps 61–69 are executed repeatedly on the next term in the rule condition part.

Figure 7:
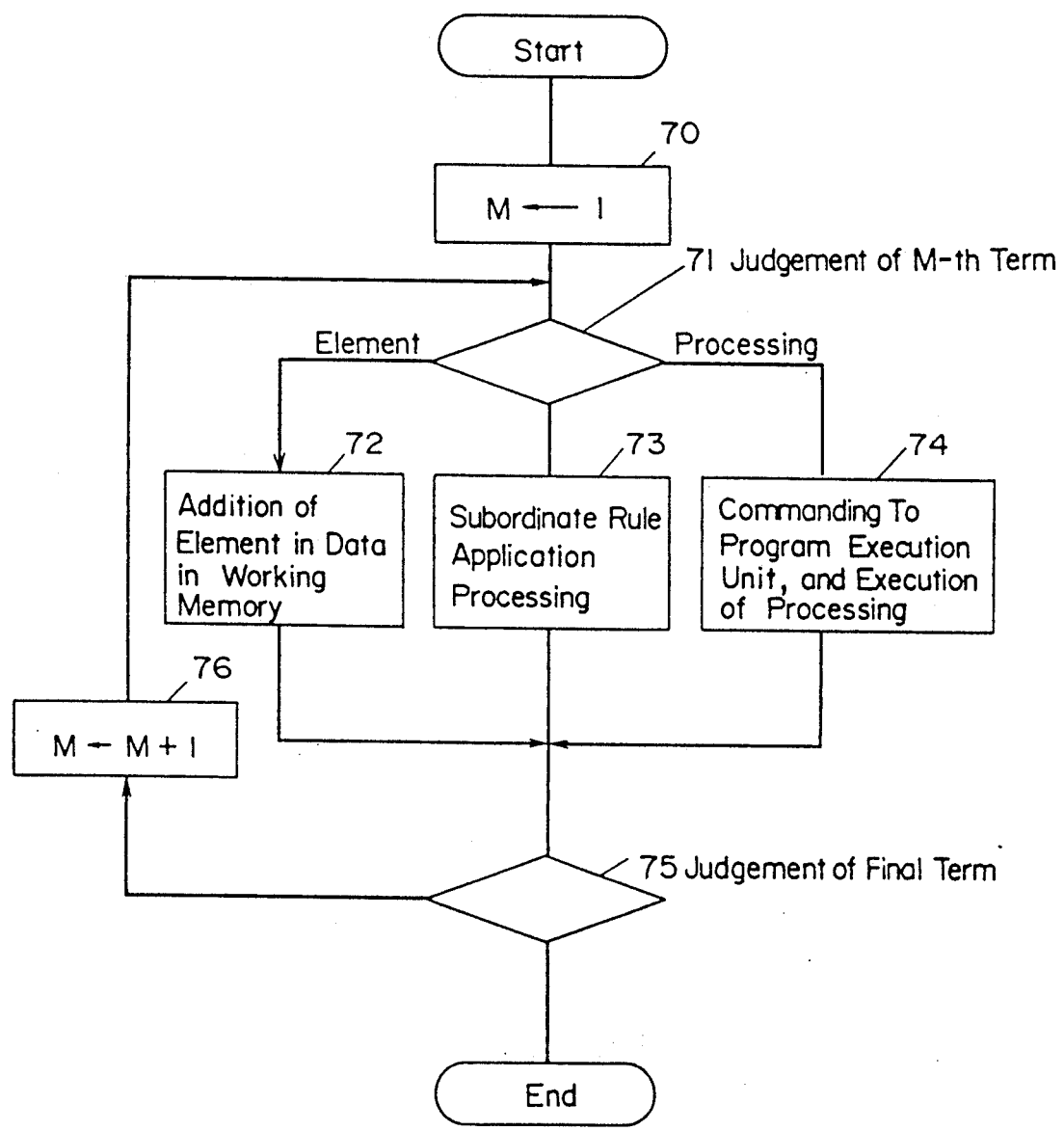
FIG. 7 is a flow chart showing an example of application processing of the rule conclusion part.

FIG. 7 is a flow chart showing an application processing example of the rule conclusion part in step 57.

A step 70 is for specifying the term to be processed in the conclusion part of the transformation rule as the first term. That is, the M-th processing term is 1.

A step 71 is for determining whether the term being processed that is the M-th term, expresses an element, the execution of the execution of a subordinate rule, or other processing. If the M-th term expresses an element, a step 73 is processed, if the M-th term expresses the execution of a subordinate rule, a step 73 is processed, and if the M-th expressed other processing, a step 74 is processed.

A step 72 is for additionally registering the element judged in the foregoing step 71 into the data stored in the working memory 3 using, the element addition unit 29 shown in FIG. 1.

A step 73 is for transmitting the information relating to the subordinate rule judged in step 71 to the local rule selection unit 31 using the rule requisition unit 30, and for executing the processing shown in the flow chart of FIG. 5 recursively, and applying the subordinate rule.

Meanwhile, when recursively executing the processing shown in the flow chart of FIG. 5, the rule selection processing 51 is particularly processed by the local rule selection unit 31.

A step 74 is for executing the various processing in step 71, in accordance with the program execution unit 6.

A step 75 is for determining whether or not the M-th term is the final term of the rule conclusion part. If it is the final term, the processing is terminated, and if, it is not the final term, 1 is added to M in step 76, and the steps 71-76 are repeatedly executed on the next term of the rule conclusion part.

This is the processing of the circuit transformation processing in the first embodiment of this invention. Additionally, in the block diagram of FIG. 1, it is also possible to process the expansion processing 52 of the rule condition part, and the expansion processing 56 of the rule conclusion part during processing of the matching processing 53 of the rule condition part, and the application processing 57 of the rule conclusion part, respectively.

The processing shown in the flow chart of FIG. 5 can be easily realized by a high-level programming language Prolog. Prolog is explained, for example, in Programming in Prolog By W. F. Clocksim, and C. S. Mellish (Springer-Verlag, 1981). The realization by Prolog is described below.

FIG. 8 shows description examples of the transformation rules shown in FIG. 3.

That is, FIG. 8(a) is a description example of the main rule shown in FIG. 3(a) and FIG. 8(b) is a description example of rule shown in FIG. 3(a), and FIG. 8(b) is a description example of the subordinate rule in FIG. 3(b). Here, the general rule shown 10 is expressed by "==>" and the local rule 11 by "@=>". In FIG. 8(a), "length (L,M)" is an incorporated predicate of Prolog meaning that the length of list L is M, and "M=<N" means similarly that M is smaller than N. The symbol "@" at the right side of the rule shows the application of the subordinate rule. The symbol "#" at the right side of the rule in FIG. 8(b) means that the expanding rule is applied to a term having the "#" mark, and that the rule should be replaced.

When such a rule as shown in FIG. 8 is stored in the knowledge base memory 1, a series of processing steps 53, 54, 55, 57 in the flow chart shown in FIG. 5 can be easily realized as follows by Prolog.

$$\text{inference } (LHS, RHS):- \\ \text{unify\_left } (LHS, L, [\ ]), \\ \text{remove\_gates } (L), \\ \text{call } (RHS). \qquad (1)$$

That is, the first argument of "inference (LHS, RHS)" is the condition part (that is, the left side) of the selected rule, and the second argument RHS is the conclusion part (or the right side) of the rule. Furthermore, "unity.left (LHS, L, [])" realizes step 53, "remove.gates (L)" realizes step 55, and "call (RHS)" realizes step 57. The judgement in step 54 depends on whether the "unity.left" predicate is successful (true) or unsuccessful (fail). The predicate "remove.gates (L)" realizes the element removal unit 27 to be carried out in the processing of step 55, and its argument L is a list of elements to be deleted, realizing the element storing means.

The processing of step 53 of FIG. 6 is the predicate "unify.left (P, L1, L2)", and such processing can be realized as follows by Prolog.

```
unify_left ((P1, P2), L1, L3):-!,
  unify_left (P1, L1, L2),
  unify_left (P2, L2, L3).
unify_left ((Gate name:::Slots), [(Gate_name:::Slots)
  IL], L):-!,
  unify_gate (Gate, Slots).
unify_left (?P, L, L):-!,
unify_left (P, _, [ ]).
unify_left ((not P), L, L):-!,
  not (unify_left (P, _, [ ])).
unify_left (P, L, L):-
```

-continued

```
P.
```

In the above Prolog clauses, the first clause means that the rule condition part is recursively processed by each term, and the second clause means that, if the term of the rule condition part, in the first argument expresses an element, a corresponding element, is retrieved in the working memory 3, and that if a corresponding element is found, that element is stored in the list of the second argument (step 65). Meanwhile, "unify.gates (Gate, Slots)" is a predicate realizing the element search unit 25, for the processing of step 62. The third clause judges that the element is not to be removed "?" (step 64), and no element is stored on the list of the second argument. The fourth clause is a portion for processing the negative expression in the term of the rule condition part, which is not explained in FIG. 6, for the sake of simplicity. The fifth clause corresponds to step 66. At this time, since the various processing programs are also realized by Prolog, the program execution unit is the processing system of Prolog (that is, the inference mechanism of Prolog) itself. Additionally, because of the cut operator "!" in the third clause, if the search element is not found in the working memory; (that is, the predicate "unify.gate " fails), the entire "unify.left" predicate fails.

The processing of step 57 shown in FIG. 7 is deduced by the processing system of Prolog by the predicate "call (RHS)". The judgement of step 71, and steps 72 and 73, can be easily realized as follows.

```
(Gate_name:::Slots):—
  add_gate (Gate_name, Slots,).!.
@P:—!, subrule_inference (@=>. P.).!.
```

Of these clauses, the first clause processes the step 72 if the term of the conclusion part of the rule expresses an element. The predicate "add.gate (Gate.name, Slots)" realizes the element addition unit 29. The second clause processes the step 73 if the term of the conclusion part of the rule expresses the application of a subordinate rule. The predicate "subrule inference (@=>.P)" is an example of realizing the rule requisition unit 30. In this case, the application processing of the subordinate rule may be realized easily by selecting the subordinate rule as shown below, and recursively executing the predicate "inference (Q, RHS)" to that subordinate rule.

```
subrule_inference (Op,P):—
  select_rule (Op, (P, Q), RHS),
  inference (Q,RHS).!.
```

Here, the predicate "select.rule (Op, (P, Q), RHS)" realizes the local rule selection unit 31. For example, with respect to the rule description shown in FIG. 8, the predicate "select.rule" can be easily described as follows.

```
select_rule(Op, LHS, RHS):—
  Rule=..[Op, LHS, RHS],
  Rule.
```

Meanwhile, in the example of realizing an embodiment using Prolog as shown above, the rule holding unit 22 is realized by holding the condition part and conclusion part of each rule, respectively, by the first argument LHS of the predicate "unify.left (LHS, L, [])" appearing in the clause (1) describing the above predicate "inference(LHS, RHS)," and the argument RHS of the predicate "call(RHS)". The general rule selection unit 21 is easily realized, as is the local rule selection unit 31, by using the unification function of Prolog.

Meanwhile, the processing of step 56 shown in the flow chart of FIG. 5 is easily realized in the following clause if the expanding rule is as described in FIG. 9.

```
#P:-!, (P#=>Q),
call(Q).
```

Likewise, the processing of step 52 may be easily realized.

An example of the description of the expanding rule shown in FIG. 3(a) is indicated in FIG. 9.

Meanwhile, in the above example realized by Prolog "@", "#", "?", "··", "not", "==>", "@=>", "#=>", ":::" and "::" are intended to be declared by the operator.

In the above example, the embodiment is realized by using the high-level programming language Prolog, but realization is also possible using other high-level programming languages, such as Lisp and C.

According to this embodiment, as is shown in FIG. 2, it is possible to collect transformation rules differing only in part of the condition part and conclusion part, and to build up these rules into a hierarchical structure comprising main rules composed of their common parts, and subordinate rules describing the differences of the individual rules, and as a result the following enumerated effects are achieved.

(1) The transformation rule may be described in a form very close to the image possessed by the designer.

(2) The rule description is simple.

(3) The quantity of description per rule can be reduced due to the construction of the rule in step structure, and simple description of elements having a bit width can be realized.

(4) Since the transformation rules can be classified, the design knowledge necessary for circuit transformation may be arranged and stored in the knowledge base.

(5) By creating the rule structure, the inference efficiency is notably improved, and the processing speed is about 4 to 7 times as high as compared with the case without such a rule structure.

Second embodiment

A second embodiment of this invention is now described below with reference to the drawings.

Figure 10:
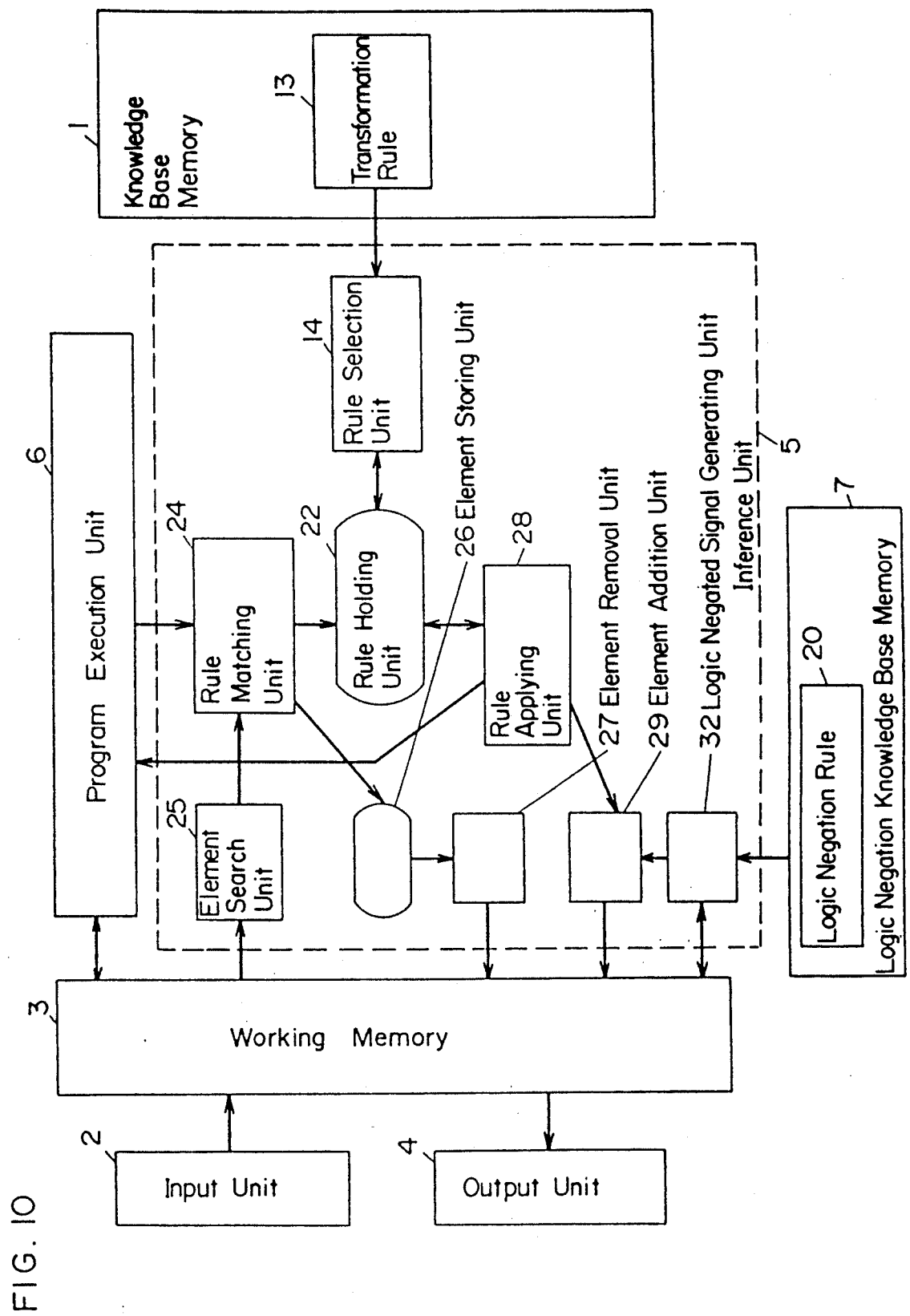
FIG. 10 is a block diagram showing a basic structure in a second embodiment of this invention.

FIG. 10 is a block diagram showing a basic structure of the second embodiment of this invention, in which numeral 1 denotes a knowledge base memory, 2 is an input unit, 3 is a working memory, 4 is an output unit, 5 is a inference unit (interpreter), 6 is a program execution unit for storing and executing programs as required, and 7 is a logic negation knowledge base memory for storing the knowledge relating to the logic negation.

The inference unit 5 is composed of rule selection unit 15, rule holding unit 22, rule matching unit 24, element search unit 25, element storing unit 26, element removal unit 27, rule applying unit 28, element addition unit 29, and logic negation signal generating unit 32.

In this embodiment, a particularly simple rule base system example is shown, but it may be easily analogized to other generalized rule base systems. Furthermore, this invention does not depend on the presence or absence of the program execution unit. The knowledge base memory and logic negation knowledge base memory may be combined to compose a single knowledge base memory (knowledge base).

These parts are described in detail below.

Figure 20:
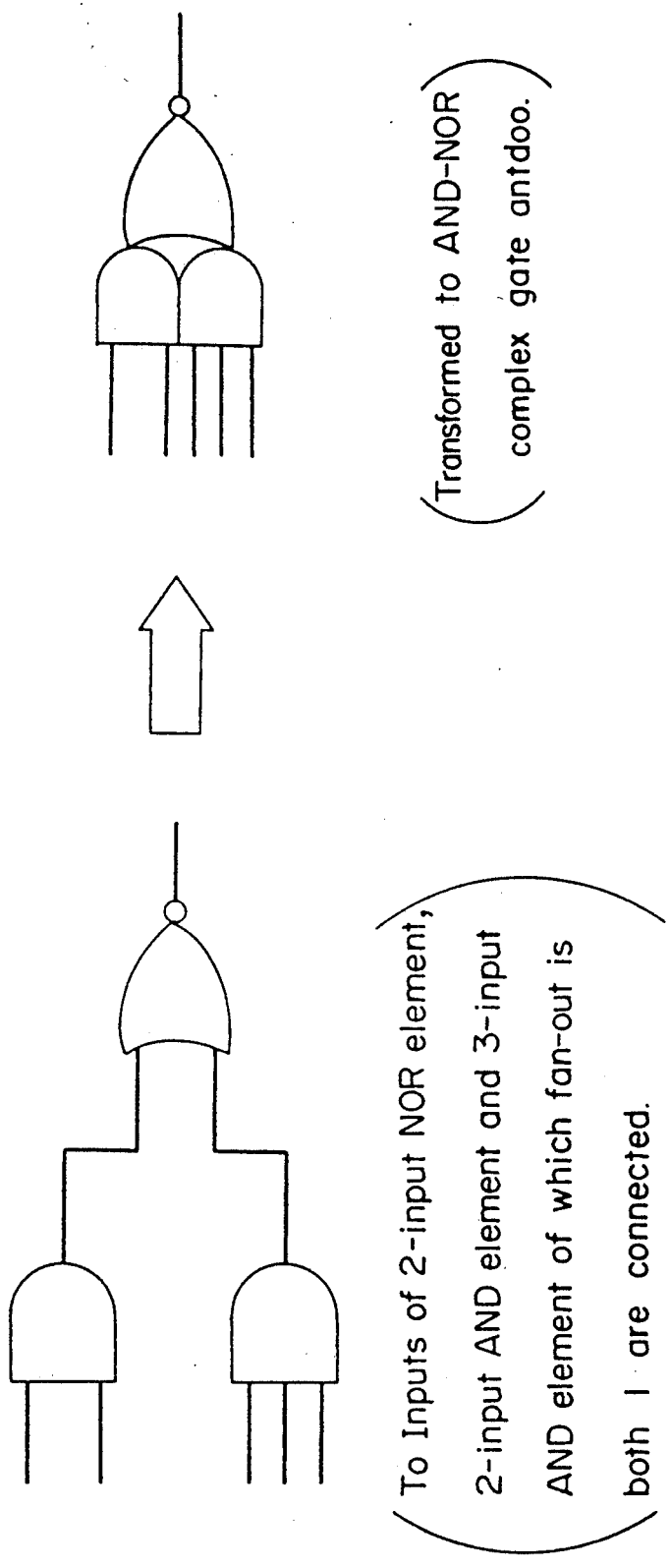
FIG. 20 is an explanatory drawing shown an example of a transformation rule.
Figure 21:
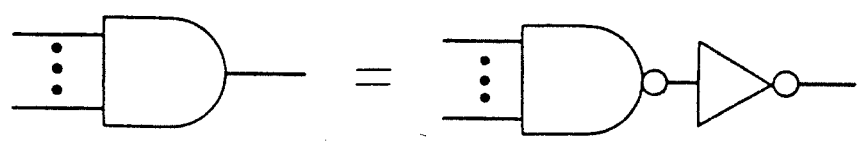
FIGS. 21(a)–(c) are explanatory drawings each showing an example of equivalent logic rule.
Figure 21:
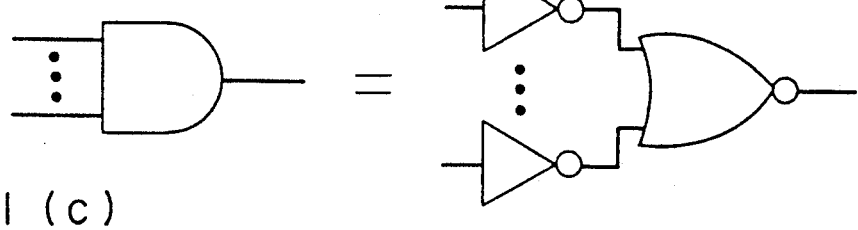
Figure 21:
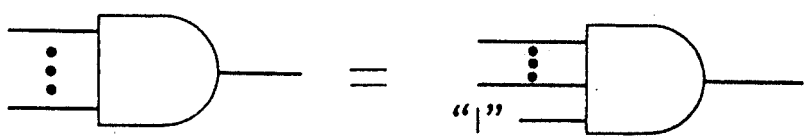

The knowledge base memory 1 stores the transformation rule 13, for example, as shown in FIG. 20.

FIG. 20 is an example of an IF-THEN type rule for transformation of a technology-independent abstract logic circuit into a logically equivalent circuit composed of standard cells of CMOS transistors. That is, the rule of FIG. 20 expresses a transformation rule, meaning "If 2 input AND elements and 3 input AND elements of which fan-out is 1 are connected to both inputs of 2 input NOR elements, they are transformed into AND-NOR compound gate antd00."

The input unit 2, working memory 3, output unit 3, inference unit 5, and program execution unit 6 correspond to those of the first embodiment.

Figure 11:
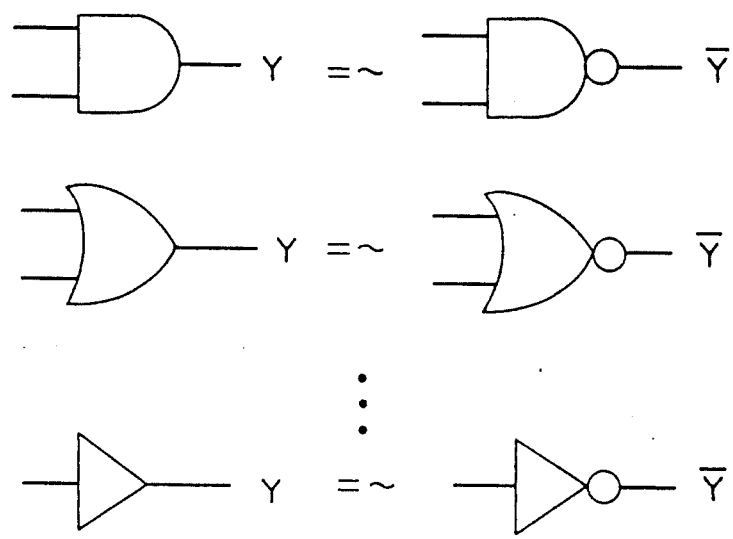
FIGS. 11(a)–(c) are explanatory drawings showing an example of a logic negation rule.
Figure 11:
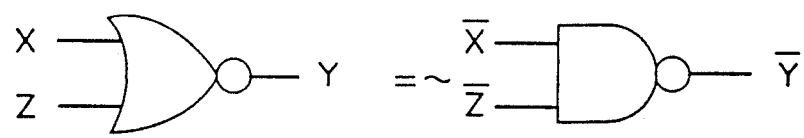
Figure 11:
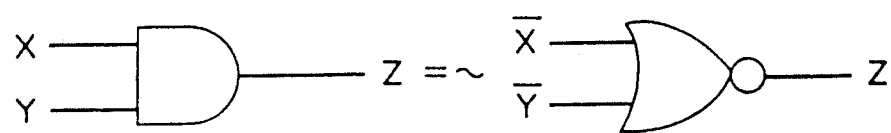

The logic negation knowledge base memory 7 stores the logic negation rule 20 indicating the logic negation relation. Examples of the logic negation rule 20 may include a rule for logically negating the output in the circuit of a same input, a rule for logically negating one of the inputs in a circuit of a same output of the contrary, and a rule for logically negating two outputs mutually such as in a flip-flop. FIG., 11A relates to a logic negation rule, particularly a rule for logically negating the output in two circuits with a same input. The example, in FIG. 11 shows the AND element and NAND element, or OR element NOR element, having the same inputs corresponding to each other by the symbol "=[" are mutually in the logically negated relation in their outputs. Additionally, in the logic negation rule, by transforming the NOR element shown in FIG. 11B into a NAND element receiving the logic negation $\overline{X}$, $\overline{Z}$ of its inputs X, Z as the inputs, the rule for generating logic negation $\overline{Y}$ of Y by the NOR element receiving the logic negation $\overline{X}$ of another input X as an input may be also used.

The operation function of each unit within the inference unit 5 is explained below together with the processing procedure.

Figure 12:
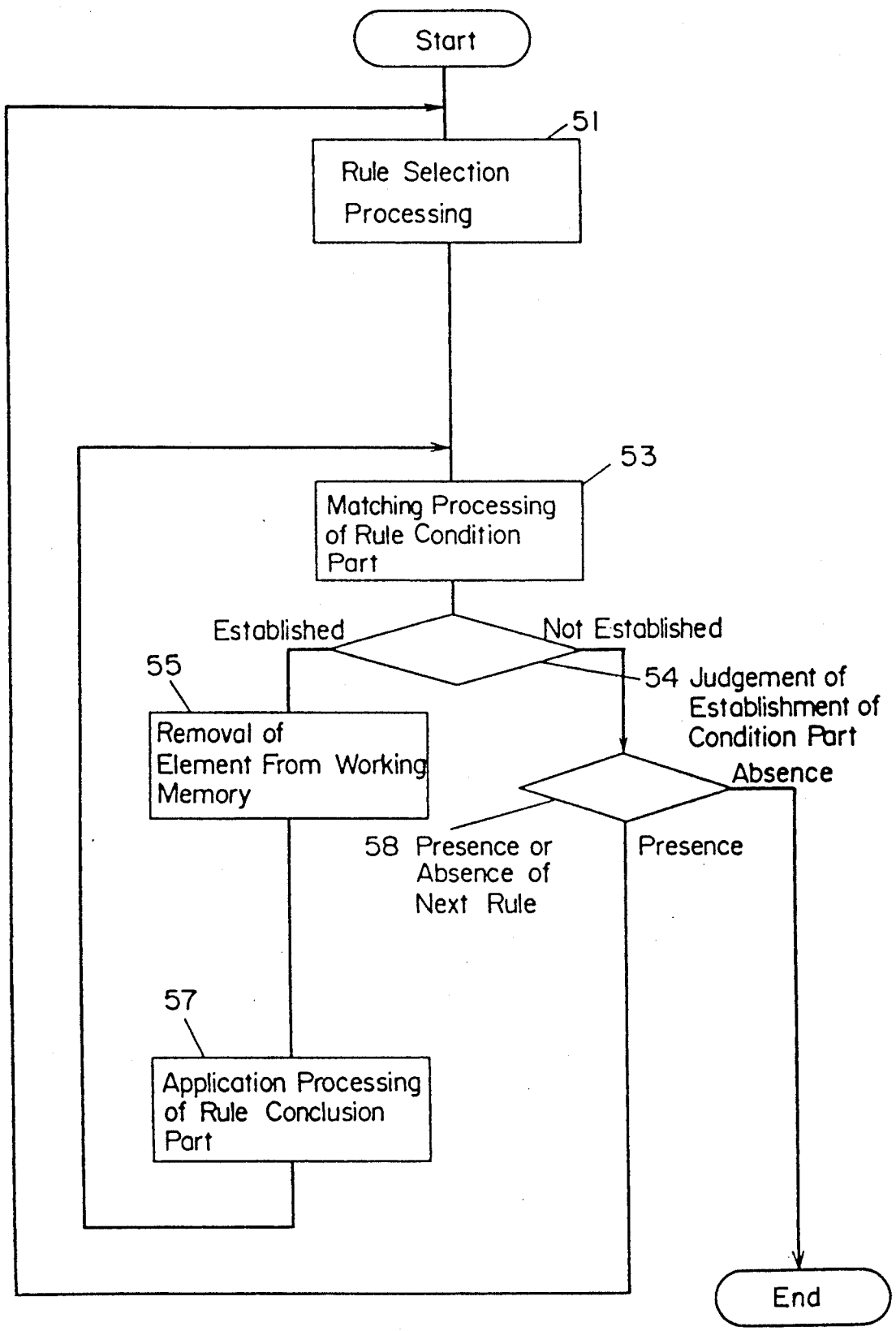
FIG. 12 is a flow chart showing an example of circuit transformation processing in the inference means of the embodiment.

FIG. 12 is a flow chart showing an example of the circuit transformation processing in the inference unit.

A processing step 51 is for selecting the transformation rules sequentially in the order of priority in consideration of the cancellation of the competition of rules. Step 51, is processed by the rule selection unit 14 shown in FIG. 10. The priority order of the transformation rules may be either specified in advance for each rule, or determined by a certain evaluation function (index) or the like.

A processing step 53 is for matching each term of the condition part of the transformation rule which is the output of processing step 51 with the data in the working memory 3 shown in FIG. 10, using the rule matching unit 24 (the details of this processing are described in FIG. 6 relating to the first embodiment).

A step 54 is for determining whether or not the condition part of the rule is established by the matching processing of step 53. If it is established, a step 55 is processed, and if it it not established, a step 58 is executed.

A processing step 55 is for removing the element stored in the element storing unit 26 sequentially from the data in the working memory 3, using the element removal unit 27 shown in FIG. 10.

A processing step 57 is for updating the data in the working memory 3, and for adding elements, using the rule applying unit 28 shown in FIG. 10. (The details of this processing are described in FIG. 7, relating to the first embodiment.)

After this processing step 57, the operation returns to processing step 53, and the same transformation rule is matched with the data in the working memory 3.

A step 58 is for determining whether or not the transformation rule to be applied next to the presently selected transformation rule is present in the knowledge base memory 1. If present, the operation returns to step 51, and the next transformation rule is selected, and if it is not present, the transformation processing is terminated.

Figure 13:
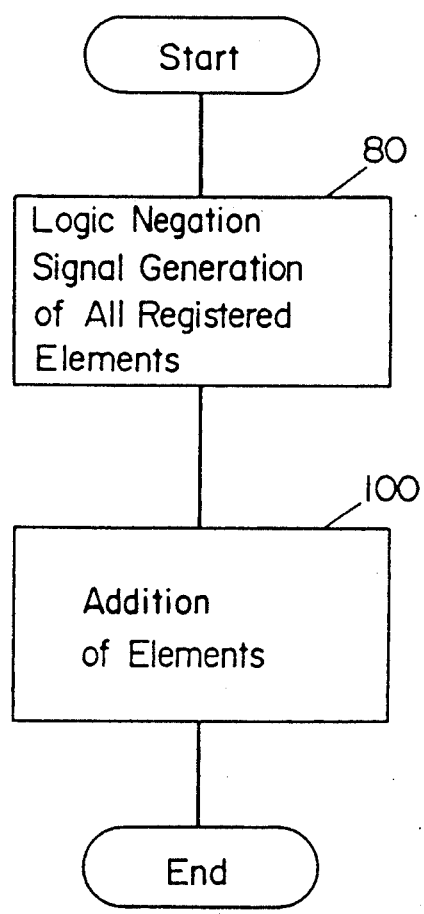
FIG. 13 is a flow chart showing an example of addition processing into the working memory.

FIG. 13 is a flow chart showing step 72 of FIG. 7 which is a principal part of this invention, and an example of a negation logic generating method which is one of the aspects of the invention.

A step 80 is for, when logic negated signal $\overline{X}_i$ is used in the input signal and output signal of the registered element, generating signal $Y_i$ which is a logic negation of that signal $X_i$ in the data circuit in the working memory 3. The details of this processing are shown in FIG. 14.

A step 100 is for replacing all logic negated signals $\overline{X}_i$ signals or output signals of a registered element with a corresponding signal $Y_i$, by using the signal $Y_i$ generated in the foregoing step 80 by the element addition unit 29 shown in FIG. 10, and for adding the element in the data in the working memory 3.

Figure 14:
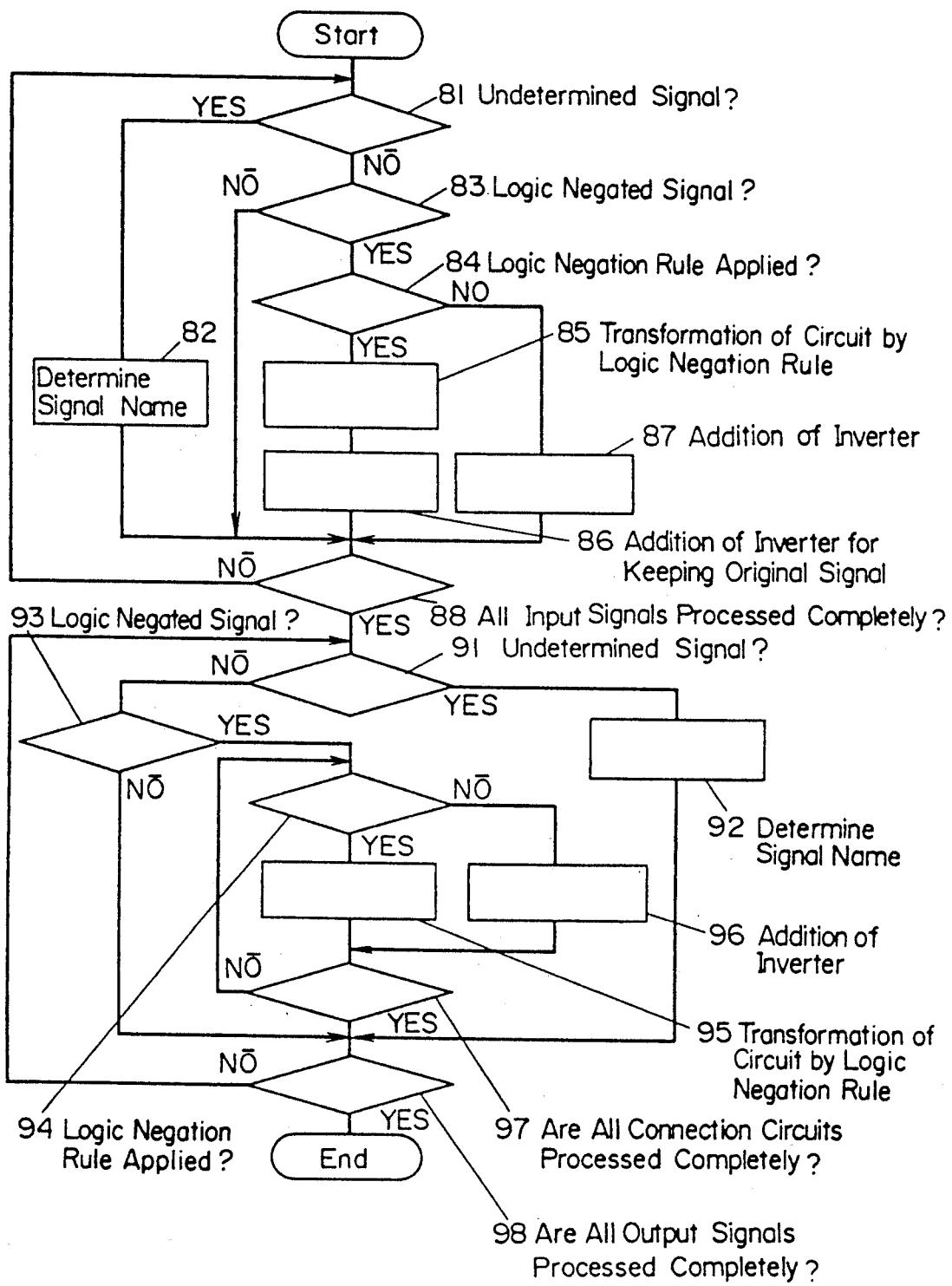
FIG. 14 is a flow chart showing an example of logic negation signal generation processing.

FIG. 14 is a flow chart showing the details of an example of step 80 shown in FIG. 13. The steps from 81 to 88 are the processing of th signals entered into the registered element, and the steps from 91 to 98 are the processing of the signals delivered from the registered element. In the example of FIG. 14, after processing of all input signals, output signals are processed. To the contrary, processing of output signals, or processing without being conscious of the sequence of input signals and output signals may be also considered. The processing is described in detail below.

First, each input signal is processed from steps 81 to 87.

The step 81 is for determining whether or not the input signal is an undetermined signal (a signal without a determined name). If it is undetermined, as a result, step 82 is processed, and otherwise step 83 is executed.

The step 82 is for assigning a signal with a signal name.

The step 83 is for determining whether or not the input signal is a logic negated signal (that is, the signal expressing the format of logical negation Y of a certain signal Y). If it is a logical negation signal, step 84 is processed, and otherwise step 88 is executed.

The step 84 is for determining which one of the logic negation rules 20 in the logic negation knowledge base memory 7 is applicable for generating a logic negated signal. That is, when generating a logic negated signal $\overline{Y}$ of signal Y, it is judged whether or not the circuit, which is either the left side (the left side of "= ~") or the right side of the logic, negation rule shown in FIG. 11A (or FIG. 11B) and of which the output signal is Y, is present in the data circuit in the working memory 3 (that is, whether matched with pattern). For instance, in the example of FIG. 11A, it is judged whether or not a 2-input AND circuit, 2-input OR circuit or the like having output signal Y is present in the data circuit in the working memory. If it is present, as a result, the logic negation rule is applicable, and step 85 is executed, and if it is not present in any rule, step 87 is executed.

The step 85 is to remove the circuit at the left side or right side (as matched in the previous step) of the logic negation rule judged to be applicable in the foregoing step 84, from the data in the working memory 3, and the corresponding right side or left side of the rule is additionally registered in the working memory 3. For example, in step 84, if the first rule FIG. 11A can be applied, the AND element of the output signal Y confirmed to be present in step 84 is removed from the working memory 3, and the NAND element of the corresponding same input signal is additionally registered in the working memory 3. Removal of an element is the same as in step 55 of FIG. 12. Addition of an element may be also realized by recursively executing step 72 of FIG. 15.

The step 86 is to additionally register the inverter having input signal $\overline{Y}$ and output signal Y in the working memory 3, in order to keep the signal Y removed by the processing of the previous step 85. It is, however, not necessary to additionally register the inverter unless an element having this signal Y as an input signal is present in the data circuit in the working memory 3 after the processing of step 85.

In the step 85, meanwhile, when transforming the inverter into a buffer (that is, when the inverter having input signal Y or output signal Y is present in the data circuit), since the output signal Y is present in the data circuit), and since the output signal or input signal of the inverter is generated signal $\overline{Y}$, step 85 is only necessary to pick up the negated signal $\overline{Y}$, and step 86 may be omitted. Likewise, if a flip-flop having an output signal Y is present in the data circuit, step 85 is only necessary to pick up the negated signal $\overline{Y}$, and step 86 is omitted.

The step 87 is for generating a logic negated signal $\overline{Y}$ by additionally registering the inverter of input signal Y into the data in the working memory 3, if any logic negation rule cannot be applied in step 84.

Addition of an inverter in steps, 86, 87 can be realized by recursively executing step 72 of FIG. 7.

The step 88 is for determining whether or not the processing of steps 81 to 87 has been effected on all input signals of the registered element. If processing has been effected on all input signals, the output signals are processed (steps 91-to 98), and otherwise steps 81 to 87 are executed again on unprocessed input signals.

For the output signals, similarly, steps 91 to 90 are executed.

The steps 91, 92, 93 are the same as the preceding steps 81, 82, 83, and are not explained herein.

The step 94 is for determining, similarly to step 84, which one of the logic negation rules 20 in the logic negation knowledge base memory 7 is applicable for generating logic negated signals. That is, when generating a logic negated signal of signal Y, it is judged whether or not the circuit located at either the left side or right side of any one of the logic negation rules, and of which ones of the input signals is signal Y, is matched with the pattern of the data in the working memory. If matched, as a result, step 95 is executed, and otherwise, step 96 is executed.

The step 95 is for generating a desire logic negated signal, by using the logic negation rule which is judged to be applicable in step 94, the same as in step 84. For example, if the 2-input AND element at the left side of the logic negation rule in FIG. 11C is matched in pattern, the element is removed from the working memory 3, and a NOR element having a same output signal and also input signals $\overline{X}$, $\overline{Y}$ is additionally registered in the working memory 3. Removal of the element is the same as in step 55 of FIG. 12. Addition of the element is realized by recursively executing step 72 of FIG. 7.

The step 96, similarly to step 87, is for generating a logic negated signal $\overline{Y}$ by additionally registering the inverter of output signal Y in the data in the working memory 3, if any logic negation rule cannot be applied in step 94.

In step 94, however, if there is a pattern match with the inverter having input signal Y, and if plural elements receiving Signal Y as an input are present in step 95, since the output signal of the inverter is $\overline{Y}$, only the negated signal $\overline{Y}$ is picked up, and the inverter is not deleted.

The step 97 is for processing steps 94 to 96 repeatedly if the logic negated signal $\overline{Y}$ has plural element inputs (that is, the fan-out is plural). When processing of steps 94 to 96 is completed on all elements receiving the signals to be logically inverted as inputs, the step 98 is executed, and otherwise steps 94 to 96 are executed on the unprocessed portion.

The step 98 is for determining, in order to execute steps 91 to 97 repeatedly individually, if the registered element has plural output signals, the same as in step 88 above.

These steps, steps 84 to 87 on the input signals, and steps 94 to 97 on the output signals, are effected by the logic negation signal generating unit 32 shown in FIG. 10.

In the above examples, generation of the logic negated signal of both input and output signals was taken into consideration, but realization is also possible in the case of an input signal only or an output signal only.

Explained so far is the circuit transformation processing in the second embodiment. Meanwhile, the processing in the flow chart of FIG. 5 may be easily realized by Prolog, exactly in the same manner as in the first embodiment.

An example of realizing the logic negation generating method (by Prolog) is briefly described below.

FIG. 16 is a description example of a logic negation rule shown in FIG. 11A.

For example, when the logic negation rule shown in FIG. 16 is stored in the logic negation knowledge base memory 7, a series of processing steps 84, 85, 86, 87 shown in the flow chart of FIG. 14 may be easily realized as follows by Prolog.

```
reverse_logic(X, Z):-
    P=(G:::a_kind_of:::_;_:::X:_),
    Q=(G:::a_kind_of:::_;_:::Z:_),
    select_rule('=∫', P, Q),
    unify_left(P, [P], [ ]),
    replace_logic(X, Z):-
    reverse_logic(X, Z):-
    create_inverter((input::X;output::Z)).
```

That is, the predicate "reverse_logic(X, Y)" means that the logic negated signal of signal X of the first argument is signal Z of the second argument. At this time, step 84 in FIG. 14 is realized by the predicate "select_rule('=~', P, X)" and the predicate "unify_left(P, [P], [])" in the first clause. Meanwhile, the predicate "replace_gate(P, Q)" realizes steps 85, 86. An example of predicate "replace_gate" is shown below.

```
replace_gate((_:::a_kind_of::inverter:_:_::_)._):-!.
replace_gate((_:::_;output(Q):::_;output(*Q)::_)._)::_!.
replace_gate(P, Q):-
    P=(G:::a_kind_of::kind;_::X:_),
    Q=(_:::_;_::Z;_),
    remove_frame(G),
    call(Q),
    create_inverter((input::Z;output::X)).
```

The first clause corresponds to the case of transforming the inverter into a buffer stated above, while the second clause corresponds to the case where a flip-flop exists. In the second clause, *Q means the terminal for delivering the logic negated signal of the output signal of output terminal Q In the third clause, the predicate "remove_frame(G)" and the predicate "call(Q)" realize step 85, and the predicate "create_inverter (input::Z;output::X)" realizes step 86.

The second clause in the above predicate "reverse_logic(X, Z)" is the portion for executing the additional processing (step 8 ) of the inverter when the logic negation rule cannot be applied.

The predicate "create_inverter" is for additionally registering the inverter in the working memory 3, which is easily realized as follows.

```
create_inverter(Slots):-
    call((_:::a_kind_of::inverter:Slots)).
```

By effectively utilizing the logic negation signal generation unit realized in Prolog, for example, the description example of FIG. 15 can express the conclusion part of the rule very simply by using the logic negated signal as shown in FIG. 17. In FIG. 17, the symbol "~" (or "-") means the logic negation. That is, "~X" means a logic negated signal of signal X. Additionally, at step 83 and 93 in FIG. 14, the judgement of whether or not the logic negated signal may be easily realized by judging if "~" is attached to the signal name. Meanwhile, in FIG. 17, it may be also considered to describe simply as "~[X1, X2]" instead of "[~X1, X2].

Furthermore, the judgement of an undetermined signal (step 81 and step 91) may be realized by judging if the signal name is a variable or not, by using the incorporated predicate "var(X)" of Prolog. In the determination of a signal name in steps 82 and 92, a signal name may be easily generated by the predicate "gensym" which is a basic predicate of Prolog.

In addition, the logic negated generating method to the output signal (steps 94, 95, 96, 97 in FIG. 14) may be also realized easily as in the case of the input signal.

In the above examples realized by Prolog, "-", "not", "==>", ":::" and "::" are intended to be declared by the operator.

In these examples, the embodiment was realized by using the high-level programming language Prolog, but realization is also possible using other high-level programming languages such as Lisp and C.

According to this embodiment, since logic negated signals can be used in the transformation rules, and since it is not necessary to be conscious of the generating method of the logic negated signals, the following enumerated effects close to the image possessed by the designer.

(1) The transformation rule may be described in a form very close to the image possessed by the designer.

(2) The rule description is simple.

(3) The quantity of description per rule can be reduced because the construction of the rule is in a step structure, and simple description of elements having a bit width can be realized.

(4) Since the transformation rules can be classified, the design knowledge necessary for circuit transformation may be arranged and stored in the knowledge base.

(5) By automatic generation of logic negated signals, the inference efficiency is notably enhanced, and the processing speed may be increased.

Third embodiment

A third embodiment of this invention is described below with reference to the accompanying drawings.

Figure 18:
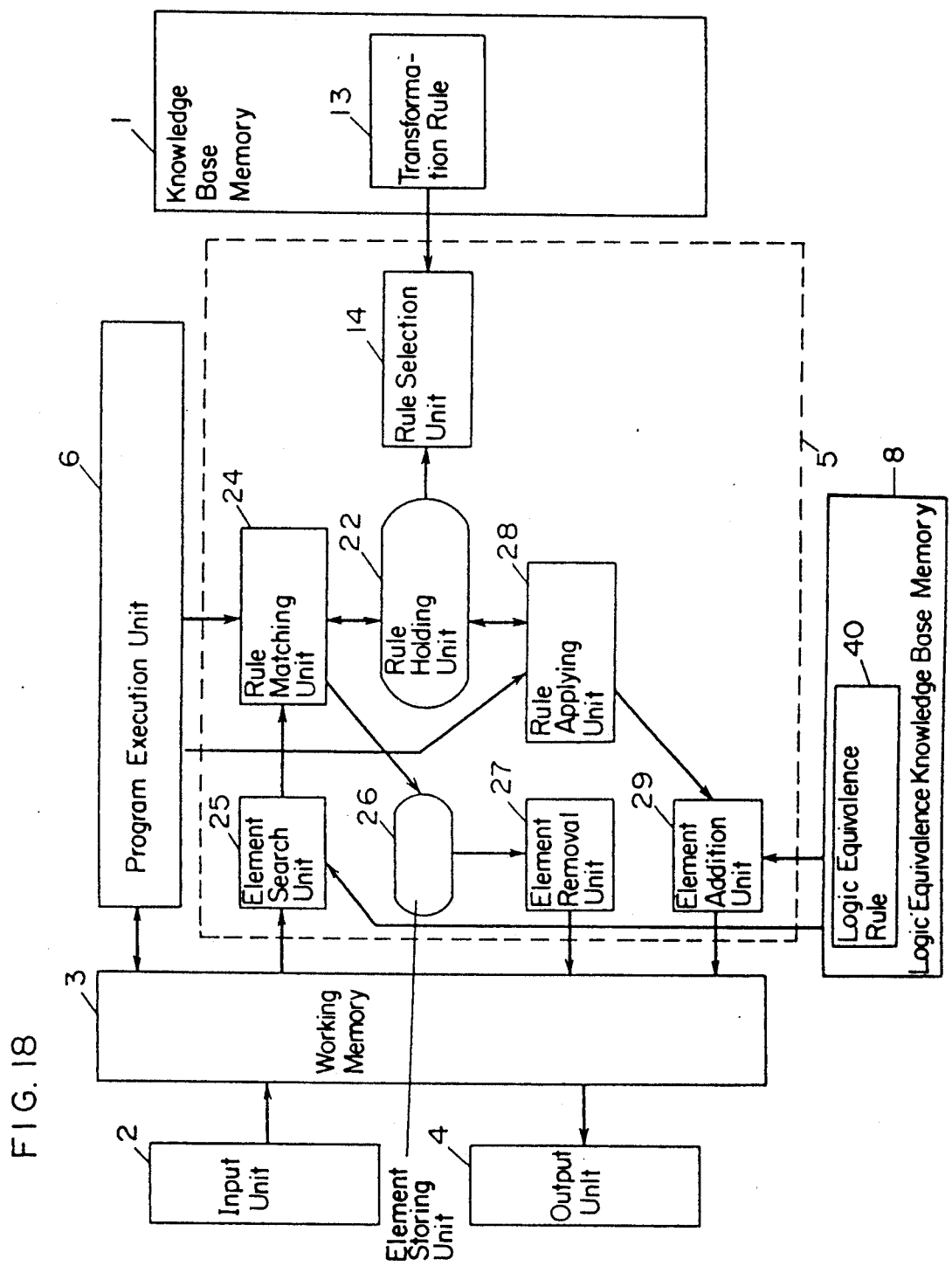
FIG. 18 is a block diagram showing a basic structure in a third embodiment of this invention.

FIG. 18 is a block diagram showing a basic structure of the third embodiment of this invention, in which numeral 1 denotes a knowledge base memory, 2 is an input unit, 3 is a working memory, 4 is an output unit, 5 is a inference unit (interpreter), 6 is a program execution unit for storing and executing programs as required, and 8 is a logic equivalence knowledge base memory for storing logic equivalence knowledge.

The inference unit 5 is composed of rule selection unit 14, rule holding unit 22, rule matching unit 24, element search unit 25, element storing unit 26, element removal unit 27, rule applying unit 28, and element addition unit 29.

In this embodiment, an example of a particularly simple rule, base system is shown, but it may be easily analogized to other generalized rule base systems. This invention, meanwhile, does not depend on, the presence or absence of the program execution unit, and the knowledge base memory and logic equivalence knowledge base memory may be combined to compose a single knowledge base memory (knowledge base).

These parts are described in detail below.

The transformation knowledge base memory 1, input unit 2, working memory 3, output unit 4, inference unit 5, and program execution unit 6 correspond to those of the first and second embodiments above.

Figure 19:
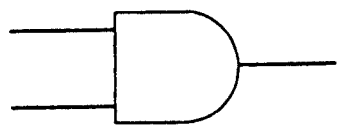
FIGS. 19(a)–(d) are circuit diagrams showing circuit equivalents of two input ANDs.
Figure 19:
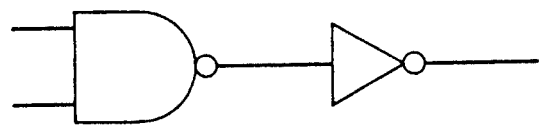
Figure 19:
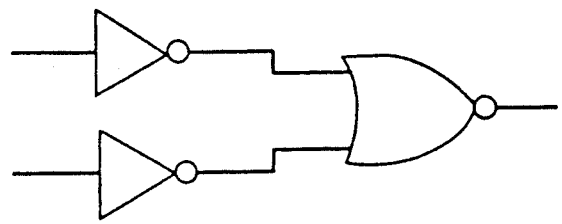
Figure 19:
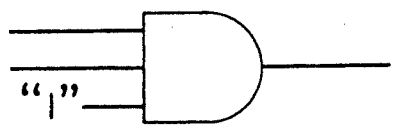

The logic equivalence knowledge base memory 8 stores logic equivalence rule 40 showing a logically equivalent relation. FIG. 19 is an example of a logic equivalence rule. FIG. 19 shows that "AND" and "logic negation of output of NAND", and "AND" and "NOR by logic negation of its input" indicated in corresponding relation by the symbol "=" are in equivalent logic relation, respectively.

The operation function of each unit in the inference unit 5 is explained together with the processing procedure.

FIG. 12 is a flow chart showing an example of the circuit transformation processing in the inference unit 5.

A processing step 51 is for selecting the transformation rules sequentially in the order of priority, the transformation rules. Step 51 is processed by the rule selection unit 14 shown in FIG. 18. The priority order of the transformation rules may be determined either beforehand for each rule, or by a certain evaluation function (index) or the like.

A processing step 53 is for matching each term of the condition part of the transformation rule which is the output of processing step 51 with the data in the working memory 3 in FIG. 18 by means of the rule matching unit 24 (details are mentioned later).

A step 54 is for determining whether or not the condition part of the rule is established by the matching processing of processing step 53. If it is established, a step 55 is executed, and if it is not established, a step 58 is executed.

A processing step 55 is for removing the elements stored in the element storing unit 26 from the data in the working memory 3 sequentially, using the element removal unit 27 shown in FIG. 18.

A processing step 57 is for updating the data in the working memory 3, and for adding elements, using the rule applying unit 28 shown in FIG. 18 (details of this processing are mentioned later).

After this processing step 57, the operation returns to processing step 53, and the same transformation rule is matched with the data in the working memory 3.

A step 58 is for determining whether or not the transformation rule to be applied next to the presently selected transformation rule is present in the knowledge base memory 1. If it is present, the operation returns to processing step 51, and the next transformation rule is selected. If it is not present, the transformation processing is terminated.

FIG. 6 is a flow chart showing an example of the match processing of the rule condition part in step 53.

A step 60 is for specifying the term to be processed in the condition part of the transformation rule as the first term. That is, term number L of the processing term is 1.

A step 61 is for determining whether or not the term being processed that is the L-th term, expresses an element. If the L-th term expresses an element, a step 62 is processed, and otherwise a step 66 is executed.

The step 62 is for determining if the element corresponding to this L-th term is present in the working memory 3, using the element search unit 25 shown in FIG. 18.

If the element corresponding to the L-th term is not present in the working memory 3, and if there is a logic equivalence rule relating to the element of the L-th term in the logic equivalence rules 40 stored in the logic equivalence knowledge base memory 8, this rule is used, and it is determined whether or not any circuit logically equivalent to the L-th element (that is, the circuit composed of a single element or plural elements) is present in the working memory 3. If present, this circuit is used instead of the L-th element, and the subsequent processing is carried out.

A step 63 is for determining whether or not the corresponding element (in its substitute circuit) was present in the foregoing step 62. If the corresponding element was present (established), a step 64 is processed and if it was not present, the processing is terminated because the condition is not established.

A step 64 is for determining whether or not the element of which existence has been confirmed in step 62 should be removed when applying this transformation rule (that is, after the rule condition is established). If the element is to be removed, a step 65 is processed, and if it is not to be removed, a step 68 is processed.

A step 65 is for storing the element judged in step 64 into the element storing unit 26 shown in FIG. 18. However, nothing is stored in the element storing unit 26 in its initial state.

A step 66 is for executing various processing such as the condition judgement represented by the L-th term, in accordance with the program execution unit 6.

A step 67 is for determining whether or not the judgement based on the processing executed in the step 66 is established. If established, a step 68 is processed, and if not established, the processing is completed since the condition is not established. Meanwhile, if the processing executed in step 66 does not require judgement, the judgement based on the processing is always regarded as being established.

A step 68 is for determining whether or not the L-th term is the, final term. If it the final term, processing is completed since the condition is established, and if it is not final, 1 is added to L in step 69, and the steps 61–69 are executed repeatedly on the next term in the rule condition part.

FIG. 7 is a flow chart showing an example of the application processing of the rule conclusion part in stp 57.

A step 70 is for specifying the term to be processed in the conclusion part of the transformation rule as the first term. That is, the M-th processing term is 1.

A step 71 is for determining whether the term in being processed that is the M-th term, expresses an element, whether it expresses the execution of a subordinate rule, or whether it expresses some other processing. If the M-th term expresses an element, a step 73 is processed, if it expresses the execution of a subordinate rule, a step 73 is processed, and if it expresses some other processing, step 74 is processed.

A step 72 is for additionally registering the element judged in the foregoing step 71 into the data in the working memory 3 using the element addition unit 29 shown in FIG. 18.

If the element to be additionally registered is not suitable as the element to compose the circuit after transformation, and if there is a logic equivalence rule relating to that element in the equivalence logic rules 40 stored in the equivalence logic knowledge base memory 8, that rule is used, and instead of the element to be additionally registered, a circuit which is logically equivalent to the element and which is appropriate (that is, a circuit composed of a single element or plural elements) is additionally registered to the working memory 3.

A step 74 is for executing the various processing judged in step 71, in accordance with the program execution unit 6.

A step 75 is for determining whether or not the M-th term is the final term of the rule conclusion part. If it is the final term, the processing is terminated, and if it is not the final term, 1 is added to M in step 76, and the steps 71–76 are repeatedly executed on the next term of the rule conclusion part.

This ends the explanation of the circuit transformation processing of the third embodiment. Next, the circuit transformation processing by employing the circuit transformation method of this invention is described below together with practical examples.

Figure 22:
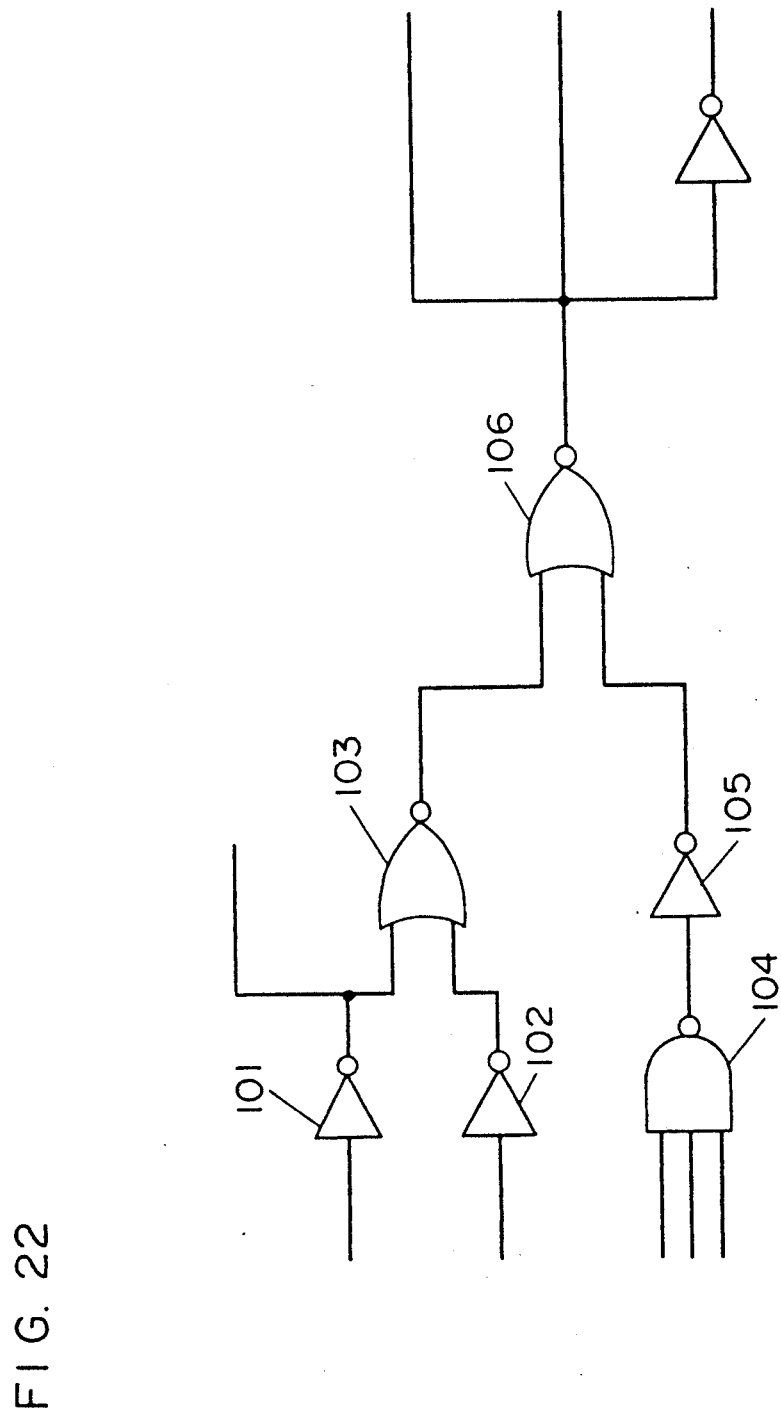
FIG. 22 is a partial circuit diagram as an example of a transformation object circuit.

FIG. 22 is an example showing part of the circuit stored in the working memory 3 in the foregoing embodiment. In the circuit shown in FIG. 22, inverter 101, inverter 102, NOR 103, NAND 104, inverter 105, and NOR 106 can be transformed into AND-NOR complex gate antd00.

In the conventional transforming method, this transformation can be realized in two manners.

Figure 23:
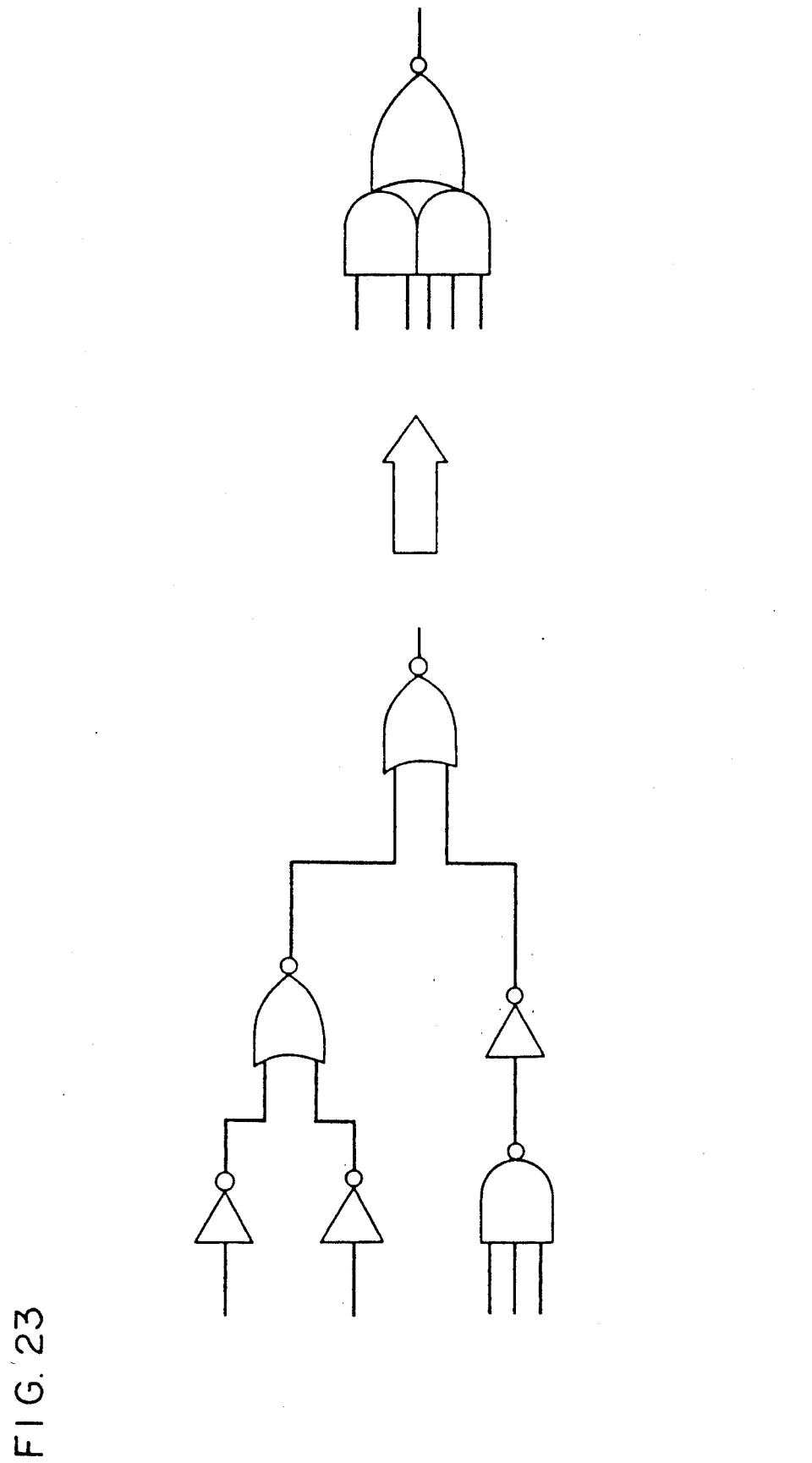
FIG. 23 is an explanatory drawing showing a transformation rule logically equivalent to the transformation rule in FIG. 20.

(1) The first manner entails making a transformation rule as shown in FIG. 23 which is logically equivalent to the rule to be transformed into the AND-NOR complex gate shown in FIG. 20, and applying it to the circuit shown in FIG. 22.

In this method, as is evident by comparing that transformation rule in FIG. 20 with the transformation rule in FIG. 23, the transformation rule is complicated, and it is necessary to make a rule corresponding to each case.

Figure 24:
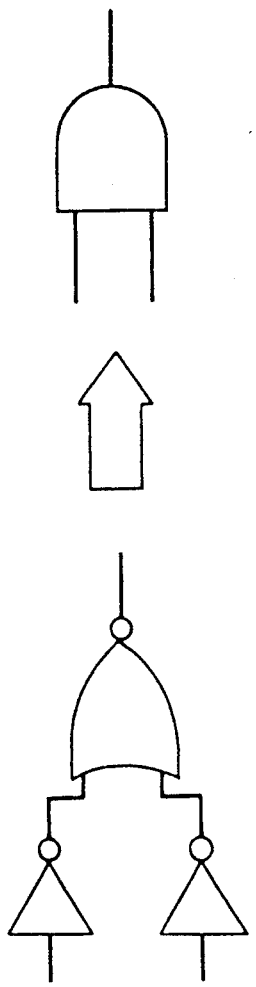
FIGS. 24(a)–(b) are explanatory drawings showing a transformation rule for transformation into an AND circuit.
Figure 24:
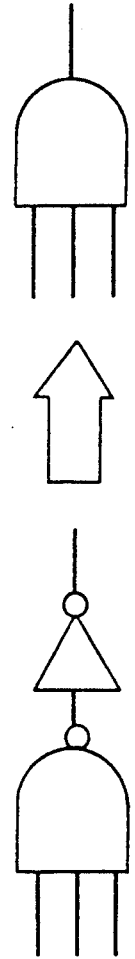

(2) In the second manner, by first applying the transformation rules a and b shown in FIG. 24, the inverter 101 and inverter 102 and NOR 103, and NAND 104 and inverter 105 shown in FIG. 22 are respectively transformed into 2-input AND and 3-input AND, and then the transformation rule shown in FIG. 20 is applied.

Figure 25:
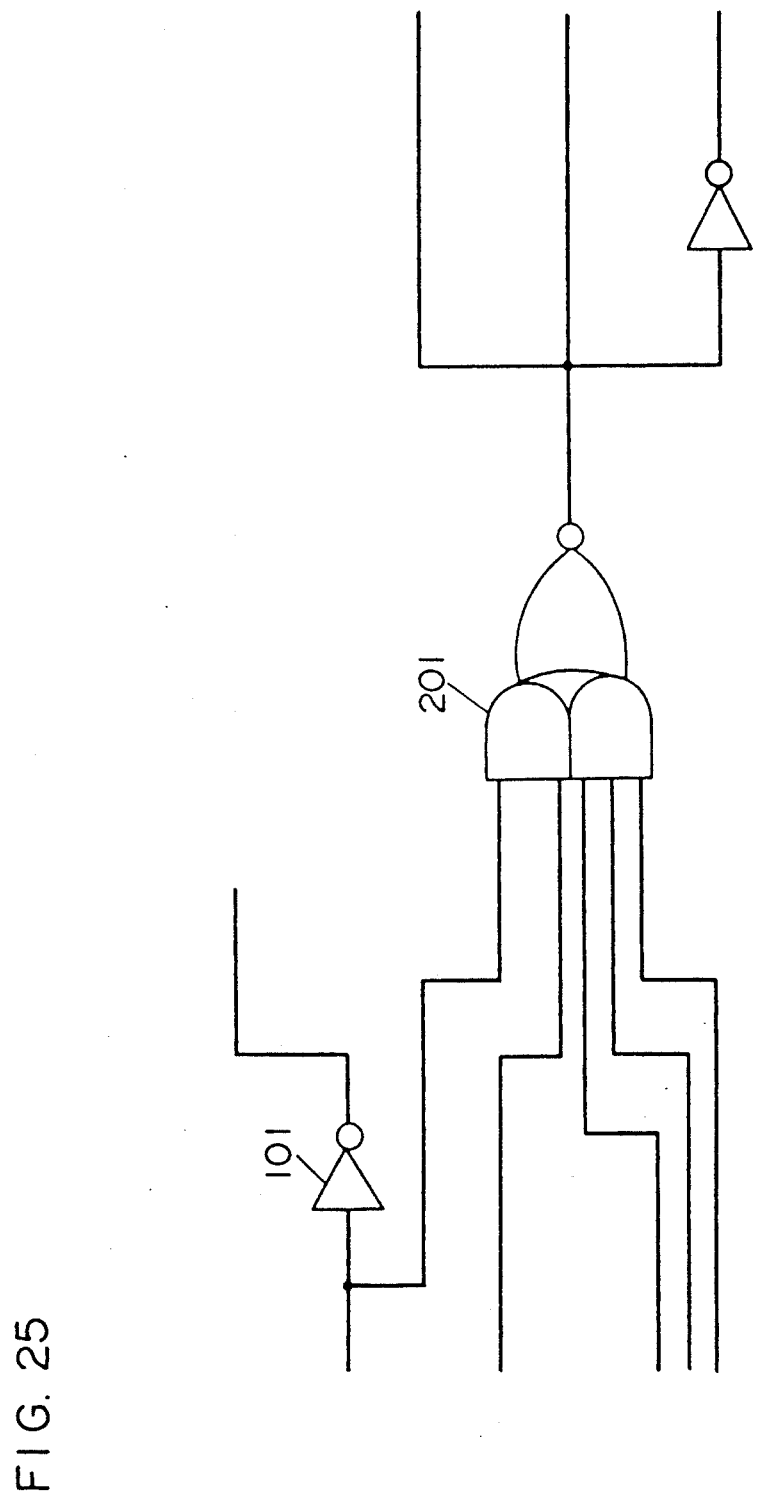
FIG. 25 is a circuit diagram after transformation of FIG. 22.

In this method, the individual transformation rules are simple, as compared with the first manner, but it is necessary to transform three times, while once is enough in the first manner, and the number of rules is increased and access to the working memory is required often. The method of this invention can solve these conventional problems. That is, when the transformation rule in FIG. 20 is applied to the circuit in FIG. 22, the inverter 101 and inverter 102 and NOR 103 are recognized as a 2-input AND by using the equivalent logic equivalence rule (b) shown in FIG. 19, and the NAND 104 and inverter 105 are recognized as a 3-input AND by using the logic equivalence rule (a) in FIG. 19, thereby transforming the circuits and generating a circuit as shown in FIG. 25.

According to this embodiment, by effectively utilizing the simple logic equivalence rules, multiple processings are possible with a small number of simple rules, and hence the following enumerated effects are achieved.

(1) The transformation rule may be described in a form very close to the image processed by the designer.

(2) The rule description is simple.

(3) The quantity of description per rule can be reduced while the number of transformation rules is decreased.

(4) Since transformation rules can be classified, the design knowledge necessary for circuit transformation can be arranged and stored in the knowledge base.

(5) The inference efficiency in notably increased by the use of logic equivalence rules, so that the processing speed may also be increased.

Meanwhile, relating to the embodiments of the logic designing system employing the circuit transformation method of the first, second or third embodiments described herein, the function description translating means for translating the function description in hardware language into connection information of function blocks is specifically described in the Japanese Patent Application No. 62-241289, and the circuit transformation means for transforming the connection information of function blocks into connection information of a circuit or logic circuit may be easily realized by the embodiments of this invention.

As explained hereabove by referring to the three embodiments, according to this invention, in the circuit transformation or logic design necessary when mounting circuits possessing a same function using different technologies (or devices), the transformation knowledge possessed by the designer can be easily taken into the system by describing a rule in a simple format, and the circuit transformation processing by computer may be carried out at a high quality as proficiently as the skilled designer, while the processing speed may be increased using the efficient inference. Furthermore, it

We claim:

1. A method of transforming a first circuit constituted by a first set of elements into a logically equivalent second circuit constituted by a second set of elements, comprising the steps of:
selecting a candidate rule from a knowledge base memory, the knowledge base memory storing transformation rules each expressed by a condition part and a conclusion part;
matching the condition part of said candidate rule to a circuit data stored in a working memory and checking an application condition of said candidate rule; and
applying said candidate rule to the circuit data stored in said working memory for transforming the circuit after confirming an establishment of said application condition,
wherein said step of applying said candidate rule comprises the steps of:
judging whether each signal of output/input signals of an element expresses a logic negation of a specific signal and extracting said signal when the element is being additionally registered into the circuit data stored in said working memory;
judging whether a logic negation rule, stored in a logic negation knowledge base memory, is applicable;
updating the circuit data and extracting said signal from the circuit data according to said logic negation rule if the logic negation rule is judged to be applicable, said signal being equivalent to the logic negation of said specific signal; and
generating said signal by adding an inverter, which accepts said specific signal, to the circuit data, if the logic negation rule is judged to be inapplicable.

2. A method of generating and extracting a logic negation signal which is equivalent to a logic negation of another signal, comprising the steps of:
judging whether a logic negation rule, stored in a logic negation knowledge base memory, is applicable to a circuit data stored in a working memory with respect to said another signal;
updating the circuit data and extracting said logic negation signal from the circuit data according to said logic negation rule, if the logic negation rule is judged to be applicable in said judging step; and
adding an inverter, which inputs a specific signal, to the circuit data, and generating said logic negation signal, if the logic negation rule is judged to be inapplicable in said judging step.

3. A method of transforming a first circuit constituted by a first set of elements into a logically equivalent second circuit constituted by a second set of elements, comprising the steps of:
selecting a candidate rule from a knowledge base memory, the knowledge base memory storing transformation rules each expressed by a condition part and a conclusion part;
matching the condition part of said candidate rule to a circuit data in a working memory and checking an application condition of said candidate rule; and
applying said candidate rule to the circuit data in said working memory for transforming the circuit after confirming an establishment of said application condition,
wherein said step of applying said candidate rule comprises the step of:
recognizing a subcircuit of the circuit data as a circuit logically equivalent to a circuit described in the condition part of said candidate rule, by using a logic equivalence rule which is stored in a logic equivalence knowledge base memory.

4. A method according to claim 3, wherein said step of applying said candidate rule further comprises the step of:
generating a subcircuit, in the circuit data, which is logically equivalent to a circuit described in the conclusion part of said candidate rule, by using a logic equivalence rule which is stored in said logic equivalence knowledge base memory.

5. A method of transforming a first circuit constituted by a first set of elements into a logically equivalent second circuit constituted by a second set of elements, comprising the steps of:
selecting a candidate rule from a knowledge base memory, the knowledge base memory storing transformation rules each expressed by a condition part and a conclusion part;
matching the condition part of said candidate rule to a circuit data stored in a working memory and checking an application condition of said candidate rule; and
applying said candidate rule to the circuit data stored in said working memory for transforming the circuit after confirming an establishment of said application condition,
wherein said step of applying said candidate rule comprises the step of:
generating a subcircuit, in the circuit data, which is logically equivalent to a circuit described in the conclusion part of said candidate rule, by using a logic equivalence rule which is stored in a logic equivalence knowledge base memory.

6. A logic design system comprising:
a knowledge base memory for storing circuit transformation information including plural types of transformation rules, each of the transformation rules being expressed by a condition part and a conclusion part;
input means for entering a functional description;
translation means for translating said functional description into a circuit data which represents a netlist of function macros;
a working memory for storing said circuit data;
circuit transformation means for transforming said circuit data constituted by a set of function macros into a logically equivalent circuit data constituted by a set of logic cells, comprising:
(a) means for selecting a candidate rule, the candidate rule being one of the transformation rules stored in said knowledge base memory;
(b) means for expanding the condition part of said candidate rule by using at least one of the transformation rules stored in said knowledge base memory;

(c) means for matching the expanded condition part of said candidate rule to the circuit data in said working memory;

(d) means for judging an application condition of said candidate rule;

(e) means for expanding the conclusion part of said candidate rule by using at least on of the transformation rules stored in said knowledge base memory; and (f) means for applying said candidate rule in which the condition part and conclusion part have been expanded to the circuit data in said working memory for transforming the circuit after confirming an establishment of said application condition of said candidate rule; and output means for delivering circuit data from said working memory.

7. A logic design system according to claim 6, wherein said means for applying said candidate rule comprises:

means for removing elements extracted from elements described in the condition part of said candidate working memory;

means for additionally registering the elements extracted from elements described in the conclusion part of said candidate rule into the data in said working memory;

means for processing and applying subordinate transformation rules stored in said knowledge base memory.

8. A logic design system comprising:

a knowledge base memory for storing circuit transformation information including plural types of transformation rules, each of the transformation rules being expressed by a condition part and a conclusion part;

a logic negation knowledge base memory for storing logic negation rules which relate a logic circuit to another logic circuit with at least one of plural negated output./input signals;

input means for entering a functional description;

translation means for translating said functional description into a circuit data which represents a netlist of function macros;

a working memory for storing said circuit data;

circuit transformation means for transforming said circuit data constituted by a set of function macros into a logically equivalent circuit data constituted by a set of logic cells, comprising:

(a) means for selecting a candidate rule, the candidate rule being transformation rules stored in said knowledge base memory;

(b) means for matching the condition part of said candidate rule to a circuit data in said working memory and checking an application condition of said candidate rule; and (c) means for applying said candidate rule to the circuit data in said working memory for transforming the circuit after confirming an establishment of the application condition of the candidate rule; and output means for delivering circuit data from said working memory;

wherein said means for applying said candidate rule comprises:

(a) means for judging each signal of the output/input signals of an element expresses the logic negation of a specific signal and for extracting said signal when the element is being additionally registered into the circuit data in said working memory;

(b) means for judging whether a logic negation rule, stored in said logic negation knowledge base memory, is applicable;

(c) means for updating the circuit data and extracting said signal from the circuit data according to said logic negation rule, if said logic negation rule is judged to be application, said signal being equivalent to the logic negation of said specific signal; and (d) means for generating said signal by adding an inverter, which accepts said specific signal, to the circuit data, if said logic negation rule is judged to be inapplicable.

9. A logic design system comprising:

a knowledge base memory for storing circuit transformation information including plural types of transformation rules, each of the transformation rules being expressed by a condition part and a conclusion part;

a logic negation knowledge base memory for storing logic negation rules which express that a circuit is logically equivalent to another circuit;

input means for entering a functional description;

translation means for translating said functional description into a circuit data which represents a netlist of function macros;

a working memory for storing said circuit data;

circuit transformation means for transforming said circuit data constituted by a set of function macros into a logically equivalent circuit data constituted by a set of logic cells, comprising:

(a) means for selecting a candidate rule, the candidate rule being one of the transformation rules stored in said knowledge base memory;

(b) means for matching the condition part of said candidate rule to a circuit data in said working memory and checking an application condition of said candidate rule; and (c) means for applying said candidate rule to the circuit data in said working memory for transforming the circuit after confirming an establishment of the application condition of the candidate rule; and output means for delivering circuit data from said working memory;

wherein said means for applying said candidate rule comprises:

(a) means for recognizing a subcircuit of the circuit data as a circuit logically equivalent to a circuit described in the condition part of said candidate rule, by using a logic equivalence rule which is stored in said logic equivalence knowledge base memory.

10. A logic design system according to claim 9, wherein said means for applying said candidate rule further comprises:

means for generating a subcircuit, in the circuit data, which is logically equivalent to a circuit described in the conclusion part of the candidate rule, by using a logic equivalence rule which is stored in said logic equivalence knowledge base memory.

11. A logic design system comprising:

a knowledge base memory for storing circuit transformation information including plural types of transformation rules, each of the transformation rules being expressed by a condition part and a conclusion part;

a logic negation knowledge base memory for storing logic negation rules which express that a circuit is logically equivalent to another circuit;

input means for entering a functional description;

translation means for translating said functional description into a circuit data which represents a netlist of function macros;

a working memory for storing said circuit data;

circuit transformation means for transforming said circuit data constituted by a set of function macros into a logically equivalent circuit data constituted by a set of logic cells, comprising:

(a) means for selecting a candidate rule, the candidate rule being one of the transformation rules stored in said knowledge base memory;

(b) means for matching the condition part of said candidate rule to a circuit data in said working memory and checking an application condition of said candidate rule; and (c) means for applying said candidate rule to the circuit data in said working memory for transforming the circuit after confirming an establishment of the application condition of the candidate rule; and output means for delivering circuit data from said working memory;

wherein said means for applying said candidate rule comprises:

(a) means for recognizing a subcircuit of the circuit data, which is logically equivalent to a circuit described in the conclusion part of the candidate rule, by using a logic equivalence rule which is stored in said logic equivalence knowledge base memory.

12. A circuit transformation system for transforming a first circuit constituted by a first set of elements into a logically equivalent second circuit constituted by a second set of elements, comprising:

a knowledge base memory for storing circuit transformation information including plural types of transformation rules, each of the transformation rules being expressed by a condition part and a conclusion part;

a working memory for storing circuit data which is indicative of a circuit being transformed;

input means for entering circuit data into said working memory;

output means for delivering circuit data from said working memory;

program execution means for storing and executing programs of processing operations including judgements, operations and functions according to said transformation rules; and inference means for inferring the second set of elements on the basis of said circuit transformation information, comprising;

(a) rule selection means for selecting a candidate rule, the candidate rule being one of the transformation rules stored in said knowledge base memory;

(b) rule holding means for holding said candidate rule;

(c) element search means for searching the circuit data stored in said working memory for an element;

(d) rule matching means for comparing the condition part of said candidate rule with the circuit data in said working memory using said element search means and said program execution means, and for checking an application condition of said candidate rule;

(e) element extraction means for extracting elements to be removed according to elements described in said candidate rule;

(f) element removal means for sequentially removing the elements extracted by said element extraction means from the circuit data stored in said working memory after the application condition of said candidate rule is established by said rule matching means;

(g) element addition means for additionally registering the element which is extracted from elements described in the conclusion part of said candidate rule into the data stored in said working memory;

(h) rule applying means for updating the data in said working memory through additionally registering elements described in said conclusion part by said program execution means after confirming an establishment of said application condition; and (i) rule requisition means for causing said rule selecting means to transmit a new transformation rule to be applied when the conclusion part of said candidate rule is executed by said rule applying means.

13. A circuit transformation system according to claim 12, wherein said inference means further comprises:

rule replacing means for selecting a transformation rule having a condition part of which matches at least a portion of the candidate rule held in the rule holding means, from the knowledge base memory, and for replacing the portion of said candidate rule matched with the condition part of said transformation rule by the conclusion part of said transformation rule.

14. A circuit transformation system for transforming a first circuit constituted by a first set of elements into a logically equivalent second circuit constituted by a second set of elements, comprising:

a knowledge base memory for storing circuit transformation information including plural types of transformation rules, each of the transformation rules being expressed by a condition part and a conclusion part;

a working memory for storing circuit data which is indicative of a circuit being transformed;

input means for entering circuit data into said working memory;

output means for delivering circuit data from said working memory;

program execution means for storing and executing programs of processing operations including judgements, operations and functions according to said transformation rules; and inference means for inferring the second set of elements on the basis of said circuit transformation information, comprising;

(a) rule selection means for selecting a candidate rule, the candidate rule being one of the transformation rules stored in said knowledge base memory;

(b) rule holding means for holding said candidate rule;

(c) element search means for searching the circuit data stored in said working memory for an element;

(d) rule matching means for comparing the condition part of said candidate rule with the circuit data stored in said working memory by using said element search means and said program execution means, for checking an application condition of said candidate rule, and for extracting elements to b removed according to elements described in said candidate rule;

(e) element storing means for storing said elements to be removed;

(f) element removal means for sequentially removing the elements extracted by said element extraction means from the circuit data stored in said working memory after the application condition of said candidate rule is established by said rule matching means;

(g) element addition means for additionally registering the element which is extracted from elements described in said candidate rule into the data stored in said working memory;

(h) rule applying means for updating the data stored in said working memory through additionally registering elements described in the conclusion part of said candidate rule by said element addition means and executing various processing operations described in the conclusion part by said program execution means after confirming an establishment of said application condition; and (i) rule requisition means for causing said rule selection means to transmit a subordinate transformation rule to be applied when th conclusion part of said candidate rule is executed by said rule applying means.

15. A circuit transformation system according to claim 14, wherein said inference means further comprises:

rule replacing means for selecting a transformation rule of which the condition part matches at least a portion of the candidate rule held in said rule holding means, from the knowledge base memory, and for replacing the portion of said candidate rule matching the condition part of said transformation rule by the conclusion part of said transformation rule.

16. A circuit transformation system for transforming a first circuit constituted by a first set of elements into a logically equivalent second circuit constituted by a second set of elements, comprising:

a knowledge base memory for storing circuit transformation information including plural types of transformation rules, each of the transformation rules being expressed by a condition part and a conclusion part;

a working memory for storing circuit data which is indicative of a circuit being transformed;

input means for entering circuit data into said working memory;

output means for delivering circuit data from said working memory;

a logic negation knowledge base memory for storing logic negation rules which relate a logic circuit to another logic circuit with at least one of plural negated output/input signals; and inference means for inferring the second set of elements on the basis of said circuit transformation knowledge, comprising:

(a) rule selection means for selecting a candidate rule, the candidate rule being one of the transformation rules stored in said knowledge base memory;

(b) rule matching means for comparing the condition part of said candidate rule with the circuit data stored in said working memory, and for checking the application condition of said candidate rule;

(c) element removal means for sequentially removing elements which are extracted from elements described in said candidate rule from the circuit data stored in said working memory after the application condition of said candidate rule is established by said rule matching means;

(d) element addition means for additionally registering the element which is extracted from elements described in said candidate rule into the data stored in said working memory;

(e) negation signal generating means for extracting and generating the logic negation signal of a specific signal from the data stored in said working memory by making use of said logic negation rules; and (f) rule applying means for updating the data stored in said working memory through additionally registering elements described in the conclusion part of said application rule by said element addition means and for execution various processing operations described in the conclusion part after confirming an establishment of said application condition, wherein said negation signal generating means searches or, if not any, generates, in said date, the signal which expresses the logic negation of said specific signal and is an output/input signal of the element being additionally registered by said element addition means.

17. A circuit transformation system according to claim 16, wherein said element addition means includes:

judgement means for judging whether each of the output/input signals of an element expresses logic negation of a specific signal, and for extracting said signal, said elements being additionally registered by the element addition means.

18. A circuit transformation system according to claim 16, wherein said element addition means includes:

assignment means for assigning new signal names to undetermined output/input signals of the element which is being additionally registered by the element addition means.

19. A circuit transformation system according to claim 16, wherein element addition means includes:

judgement means for judging whether each signal of the output/input signals of an element expresses logic negation of a specific signal, and for extracting said signal, said elements being additionally registered by the element addition means; and assignment means for assigning undetermined signals out of said output/input signals with new signal names.

20. A circuit transformation system for transforming a first circuit constituted by a first set of element into a logically equivalent second circuit constituted by a second set of elements, comprising:

a knowledge base memory for storing circuit transformation information including plural types of transformation rules each expressed by a condition part and a conclusion part;

a working memory for storing circuit data which is being transformed;

input means for entering circuit data into said working memory;

output means for delivering circuit data from said working memory;

a logic negation knowledge base memory for storing logic equivalence rules which express that a circuit is logically equivalent to another circuit; and inference means for inferring the second set of elements on the basis of said circuit transformation information, comprising:

(a) rule selection means for selecting a candidate rule, the candidate rule being one of the transformation rules stored in said knowledge base memory;

(b) circuit recognition means for recognizing a subcircuit of the data as a circuit logically equivalent to a circuit described in the condition part of said candidate rule, by using said logic equivalence rules; and (c) rule matching means for comparing the condition part of said candidate rule with the data stored in said working memory by said circuit recognition means, and for checking an application condition of said candidate rule.

21. A circuit transformation system according to claim 20 wherein said inference means further comprises:

element removal means for sequentially removing elements which are extracted from elements described in said candidate rule from the data stored in said working memory, after the application condition of said candidate rule is established by said rule matching means;

element addition means for additionally registering the element which is extracted from elements described in said candidate rule into the data stored in said working memory;

circuit generating means for generating a subcircuit, in the data, which is logically equivalent to a circuit described in the conclusion part of said candidate rule through said element addition means, by using said logic equivalence rule; and rule applying means for updating the data stored in said working memory, through additionally registering a circuit described in the conclusion part of said candidate rule by said circuit generating means and execution various processing operations described in said conclusion part, after confirming an establishment of said application condition.

22. A circuit transformation system for transforming a first circuit constituted by a first set of elements into a logically equivalent second circuit constituted by a second set of elements, comprising:

a knowledge base memory for storing circuit transformation information including plural types of transformation rules, each of the transformation rules being expressed by a condition part and a conclusion part;

a working memory for storing circuit data which is being transformed;

input means for entering circuit data into said working memory;

output means for delivering circuit data from said working memory;

a logic negation knowledge base memory for storing logic equivalence rules which express that a circuit is logically equivalent to another circuit; and inference means for inferring the second set of elements on the basis of said circuit transformation information, comprising:

(a) rule selection means for selecting a candidate rule, the candidate rule being one of the transformation rules stored in said knowledge base memory;

(b) rule matching means for comparing the condition part of said candidate rule with the data stored in said working memory, and for checking an application condition of said candidate rule, (c) element removal means of sequentially removing elements which are extracted from elements described in said candidate rule from the data stored in said working memory, after the application condition of said candidate rule is established by said rule matching means;

(d) element addition means for additionally registering the element which is extracted from elements described in said candidate rule into the data stored in said working memory;

(e) circuit generating means for generating a subcircuit, in the data, which is logically equivalent to a circuit described in the conclusion part of said candidate rule through said element addition means, by using said logic equivalence rules; and (f) rule applying means for updating the data stored in said working memory, through additionally registering a circuit described in the conclusion part of said candidate rule by said circuit generating means and executing various processing operations described in said conclusion part, after confirming an establishment of said application condition.

23. A method of transforming a first circuit constituted by a first set of elements into a logically equivalent second circuit constituted by a second set of elements, comprising th steps of:

selecting a candidate rule from a knowledge base memory, the knowledge base memory storing transformation rules each expressed by a condition part and a conclusion part;

expanding said candidate rule by using at least one of the transformation rules stored in said knowledge base memory;

matching an expanded condition part of said candidate rule to a circuit data stored in a working memory;

judging an application condition of said candidate rule; and applying said candidate rule which has been expanded, to the circuit data in said working memory for transforming the circuit, after confirming an establishment of said application condition.

24. A method according to claim 23, wherein said step of applying said candidate rule comprises the steps of:

removing elements extracted from elements described in the condition part of said candidate rules from the data stored in said working memory;

additionally registering the elements which are extracted from elements described in the conclusion part of said candidate rule into the data stored in said working memory;

processing and applying subordinate transformation rules stored in said knowledge base memory.

25. A method of transforming a first circuit constituted by a first set of elements into a logically equivalent second circuit constituted by a second set of elements, comprising the steps of:

selecting a candidate rule from a knowledge base memory, the knowledge base memory storing transformation rules each expressed by a condition part and a conclusion part;

expanding the condition part of said candidate rule by using at lest one of the transformation rules stored in said knowledge base memory;

matching the expanded condition part of said candidate rule to a circuit data stored in a working memory;

judging an application condition of said candidate rule;

expanding the conclusion part of said candidate rule by using at least one of the transformation rules stored in said knowledge base memory; and applying said candidate rule in which the condition part and conclusion part have been expanded to the circuit data stored in said working memory for transforming the circuit, after confirming an establishment of said application condition of said candidate rule.

26. A method according to claim 25, wherein said step of applying said candidate rule comprises the steps of:

removing elements extracted from elements described in the condition part of said candidate rules from the data stored in said working memory;

additionally registering the elements which are extracted from elements described in the conclusion part of said candidate rule into the data stored in said working memory;

processing an application of subordinate transformation rules stored in said knowledge base memory.

* * * * *